US009326337B2

(12) United States Patent
Nam et al.

(10) Patent No.: US 9,326,337 B2
(45) Date of Patent: Apr. 26, 2016

(54) LIGHT EMITTING DEVICE (LED) ARRAY UNIT AND LED MODULE COMPRISING THE SAME

(71) Applicant: SAMSUNG ELECTRONICS CO., LTD., Suwon-Si (KR)

(72) Inventors: Kyung-Pil Nam, Suwon (KR); Ki-Won Choi, Suwon (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 151 days.

(21) Appl. No.: 14/179,162

(22) Filed: Feb. 12, 2014

(65) Prior Publication Data

US 2014/0225517 A1    Aug. 14, 2014

(30) Foreign Application Priority Data

Feb. 12, 2013 (KR) .................... 10-2013-0014974

(51) Int. Cl.
| H05B 37/02 | (2006.01) |
| H05B 33/08 | (2006.01) |
| F21K 99/00 | (2010.01) |
| F21V 23/00 | (2015.01) |
| H01L 33/08 | (2010.01) |
| H01L 33/38 | (2010.01) |

(52) U.S. Cl.
CPC .............. *H05B 33/0821* (2013.01); *F21K 9/10* (2013.01); *F21V 23/00* (2013.01); *H05B 33/0845* (2013.01); *H01L 33/08* (2013.01); *H01L 33/382* (2013.01)

(58) Field of Classification Search
CPC ........... H05B 33/0815; H05B 33/0803; H05B 33/0827; H05B 33/0845; H05B 33/0821; F21K 9/10

USPC ..................... 315/291, 294, 307, 185 R, 312; 362/231, 236, 240, 373, 555; 347/236–238

See application file for complete search history.

(56) References Cited

U.S. PATENT DOCUMENTS

| 7,097,337 | B2 * | 8/2006 | Kim ................. | G02F 1/133603 362/231 |
| 7,458,667 | B2 * | 12/2008 | Kitabatake ........... | B41J 2/17546 347/19 |
| 7,714,517 | B2 * | 5/2010 | Shih ................... | H05B 33/0857 315/291 |
| 7,821,027 | B2 * | 10/2010 | Shin ..................... | H01L 33/647 257/100 |
| 8,018,170 | B2 * | 9/2011 | Chen ................. | H05B 33/0815 315/185 R |
| 8,913,213 | B2 * | 12/2014 | Kim ................. | G02F 1/133603 349/69 |
| 2012/0018764 | A1 * | 1/2012 | Choi ....................... | H01L 33/20 257/99 |

FOREIGN PATENT DOCUMENTS

| JP | 4-223762 A | 8/1992 |
| JP | 2006-278125 A | 10/2006 |

(Continued)

*Primary Examiner* — Haissa Philogene
(74) *Attorney, Agent, or Firm* — McDermott Will & Emery LLP

(57) ABSTRACT

A light emitting device (LED) array module includes at least one terminal, a light emitting device (LED) array, and a rank storing device. The LED array includes a plurality of LEDs that emit light when a current is supplied from the outside of the LED array module. The rank storing device is configured to store rank information of the LED array that depends on brightness characteristics of the LEDs, and to output a signal corresponding to the rank information via the at least one terminal.

19 Claims, 18 Drawing Sheets

(56) References Cited

FOREIGN PATENT DOCUMENTS

| JP | 2010-267481 A | 11/2010 |
| KR | 20-0270644 A | 4/2002 |
| KR | 2005-0097162 A | 10/2005 |
| KR | 2010-0108302 A | 10/2010 |
| KR | 10-1024965 B1 | 3/2011 |
| KR | 2012-0055923 A | 6/2012 |

* cited by examiner

OR

FIG. 4A
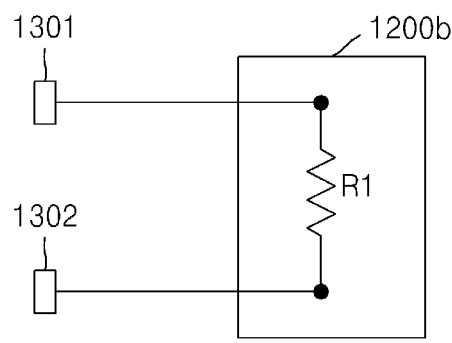
FIG. 4B
| RANK | R1 (ohm) |
|------|----------|
| 1 | 1k |
| 2 | 10k |
| 3 | 100k |
| 4 | 1M |
FIG. 5
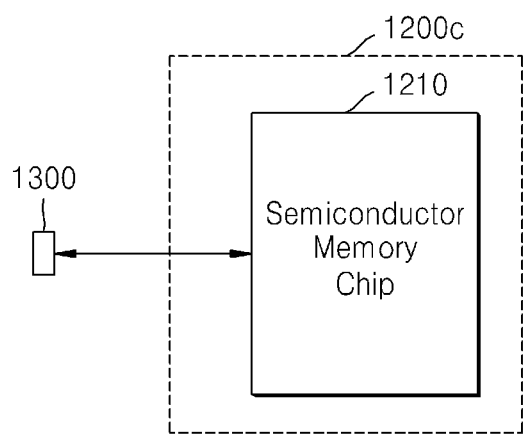

(a)

(b)

LIGHT EMITTING DEVICE (LED) ARRAY UNIT AND LED MODULE COMPRISING THE SAME

CROSS-REFERENCE TO RELATED APPLICATIONS

This application claims benefit of the priority of Korean Patent Application No. 10-2013-0014974, filed on Feb. 12, 2013, in the Korean Intellectual Property Office, the entire contents of which are hereby incorporated by reference.

TECHNICAL FIELD

The present inventive concept relates to a light emitting device (LED) array unit and an LED module including the LED array unit, and more particularly, to an LED array unit that stores rank information corresponding to the brightness characteristics of LEDs, and an LED module including the LED array unit.

BACKGROUND

LEDs are being used in various applications because they consume less power than and are smaller than light sources such as fluorescent lamps or incandescent lamps. In particular, an array in which a plurality of LEDs are connected to one another is being used as the light sources of lamps that are mounted on front sides, rear sides, and lateral sides of recent automobiles.

As the intensity of light emitted by LEDs increases, the magnitude of a current that passes through each LED increases. However, due to the characteristics of components of LEDs or the influences of LED manufacturing processes, the relationship between the intensity of light emitted by an LED and the magnitude of a current that passes through the LED may be different for different LEDs. In other words, even when the same magnitude of current passes through LEDs produced via the same manufacturing process, the LEDs may output light beams with different intensities. Since applications that use LEDs as a light source need light with a constant intensity, the intensities of light beams emitted by the LEDs need to be compensated for their deviations from the constant intensity.

SUMMARY

The present inventive concept relates to a light emitting device (LED) array unit and an LED module including the LED array unit, and more particularly, an LED array unit that compensates for the brightness characteristics of LEDs by using rank information stored in the LED array unit, and an LED module including the LED array unit.

An aspect of the present inventive concept encompasses an LED array module including at least one terminal; an LED array comprising a plurality of LEDs that emit light when a current is supplied from the outside of the LED array module; and a rank storing device which stores rank information of the LED array that depends on brightness characteristics of the LEDs, and which outputs a signal corresponding to the rank information via the terminal.

The terminal may include first and second terminals, and the LED array may have a first rank or a second rank. According to the rank storing device, when the LED array has the first rank, the first and second terminals may be open, and, when the LED array has the second rank, the first and second terminals may be connected to each other via a resistor or shorted.

The terminal may include first and second terminals, the rank storing device may include a resistor connected between the first and second terminals, and the resistor may have different resistances according to ranks of the LED array.

The rank storing device may include a semiconductor memory chip connected to the terminal, and the semiconductor memory chip may store the rank information.

The ranks of the LEDs may be identical, and the rank of the LED array may be identical with each of the ranks of the LEDs.

Another aspect of the present inventive concept relates to an LED module including an LED array unit and an LED driving device. The LED array unit includes an LED array including a plurality of LEDs, and a rank storing device that stores rank information of the LED array according to the brightness characteristics of the LEDs. The LED driving device supplies a current to the LED array and controls a magnitude of the current according to the rank information stored in the rank storing device.

The LED array unit may further include at least one terminal, and the rank storing device may output a signal corresponding to the rank information via the terminal. The LED driving device may include a rank detecting device which is connected to the terminal and detects the signal corresponding to the rank information stored in the rank storing device, and an adjustable current output device which outputs a current for driving the LED array and is controlled by the rank detecting device.

The terminal may include first and second terminals, and the LED array may have a first rank or a second rank. According to the rank storing device, when the LED array has the first rank, the first and second terminals may be open, and, when the LED array has the second rank, the first and second terminals may be connected to each other via a resistor or shorted.

The rank detecting device may apply first and second voltages to the first and second terminals, respectively, and the adjustable current output device may be connected to the second terminal and adjust a magnitude of a current that is output according to a voltage of the second terminal.

The rank detecting device may include a microcontroller, the first or second terminal may be connected to an input port of the microcontroller, and the microcontroller may determine a rank of the LED array according to a voltage of the input port.

The terminal may include first and second terminals, the rank storing device may include a resistor connected between the first and second terminals, and the resistor may have different resistances according to ranks of the LED array.

The rank detecting device may detect a resistance of the resistor to determine the rank of the LED array.

The rank detecting device may include a current source circuit which supplies a constant current to the first or second terminal, and a voltage measuring circuit which measures a voltage between the first and second terminals.

The rank detecting device may include a voltage source circuit which applies a constant current to between the first and second terminals, and a current measuring circuit which measures a current that flows to the first or second terminal.

The rank detecting device may control the adjustable current output device to supply a current that enables the LED array to emit light with an intensity suitable for lamps for use in vehicles.

BRIEF DESCRIPTION OF THE DRAWINGS

The foregoing and other features of the present inventive concept will be apparent from more particular description of embodiments of the present inventive concept, as illustrated in the accompanying drawings in which like reference characters may refer to the same or similar parts throughout the different views. The drawings are not necessarily to scale, emphasis instead being placed upon illustrating the principles of the embodiments of the present inventive concept.

FIGS. 4A and 4B illustrate a rank storing device according to an embodiment of the present inventive concept.

FIG. 5 is a block diagram of a rank storing device according to an embodiment of the present inventive concept.

DETAILED DESCRIPTION OF THE EMBODIMENTS

Figure 1:
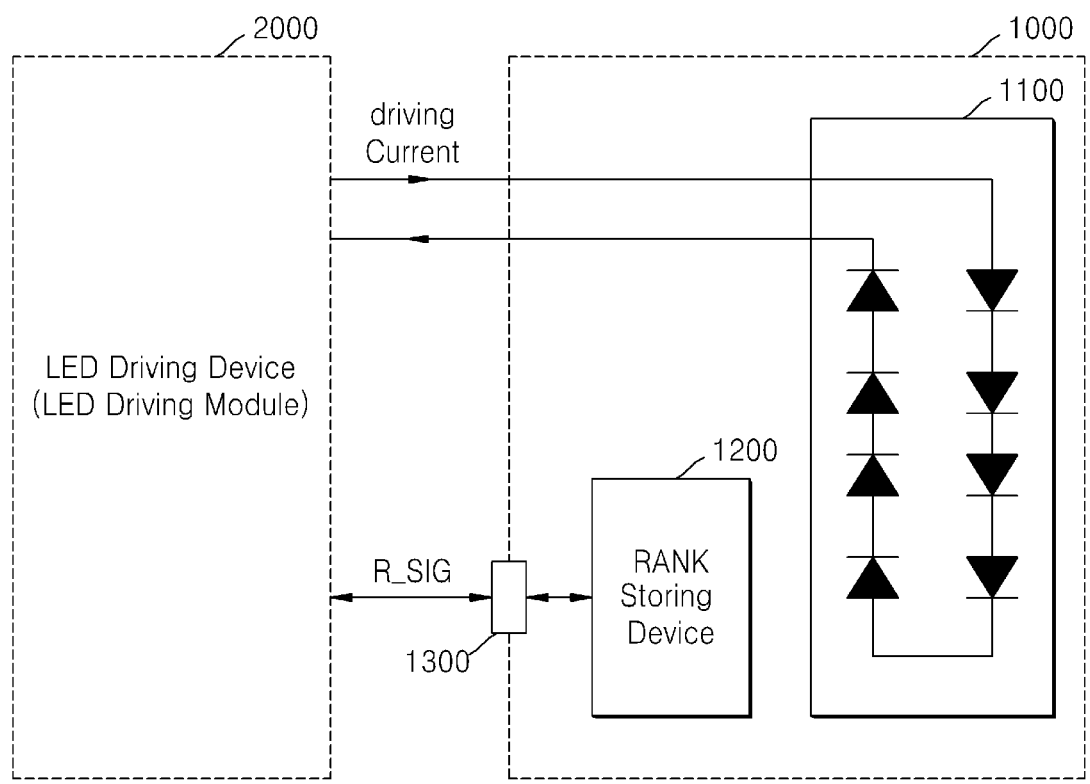
FIG. 1 is a block diagram of a light emitting device (LED) module according to an embodiment of the present inventive concept.

Exemplary embodiments of the present inventive concept will be described below in more detail with reference to the accompanying drawings. The present inventive concept may, however, be embodied in many different forms and should not be construed as being limited to the embodiments set forth herein; rather, these embodiments are provided so that this disclosure will be thorough and complete, and will fully convey the present inventive concept to those of ordinary skill in the art. As used herein, the term "and/or" includes any and all combinations of one or more of the associated listed items. Expressions such as "at least one of," when preceding a list of elements, modify the entire list of elements and do not modify the individual elements of the list. Like reference numerals may refer to like elements throughout the specification.

FIG. 1 is a block diagram of a light emitting device (LED) module 100 according to an embodiment of the present inventive concept. The LED module 100 may include an LED array unit 1000 and an LED driving device 2000. The LED array unit 1000 may be referred to as an LED array module (LAM), and the LED driving device 2000 may be referred to as an LED driving module (LDM). The LED array unit 1000 and the LED driving device 2000 may be manufactured as separate modules and may be assembled into the LED module 100 and connected to each other.

As illustrated in FIG. 1, the LED array unit 1000 may include an LED array 1100, a rank storing device 1200, and at least one terminal 1300. The LED array 1100 may include a plurality of LEDs, which may be serially connected to one another. Although the LED array 1100 of FIG. 1 includes a single string in which all of the LEDs are serially connected, the LED array 1100 may include a plurality of strings connected to one another in parallel.

The relationship between the intensity of light emitted by an LED and a current (hereinafter, referred to as a driving current) that passes through the LED may vary depending on LEDs. According to this LED characteristic, the brightness level of each LED may be determined via a test included in an LED manufacturing process, according to the relationship between the intensity of light emitted by an LED and a driving current of the LED. As such, the brightness level of each LED determined according to the characteristics of the LED is referred to as a rank. For example, an LED having a rank of 1 may emit stronger light than an LED having a rank of 2 if the two LEDs are provided with LED driving currents having the same magnitude. The number of ranks may be 2 or more, and may be determined according to the type of LEDs or applications that use LEDs.

The LED array unit 1000 may receive a current from the LED driving device 2000, and may emit light via the LED array 1100 including LEDs, each of which emits light. Since an LED emits stronger light as the magnitude of a driving current of the LED increases, the intensity of light emitted by the LED array unit 1000 may increase as the magnitude of a current received from the LED driving device 2000 increases.

According to an embodiment of the present inventive concept, the LED array unit 1000 may include the rank storing device 1200. The rank storing device 1200 may store rank information of the LED array 1100. During the manufacturing of the LED array 1100, the rank of the LED array unit 1100 may be determined according to the ranks of the LEDs included in the LED array 1100 or may be determined by testing the LED array 1100. As illustrated in FIG. 1, the rank storing device 1200 may output a signal R_SIG corresponding to the stored rank information of the LED array 1100 to the outside via the terminal 1300.

According to an embodiment of the present inventive concept, the LEDs included in the LED array 1100 may have the same ranks, and the rank of the LED array 1100 may be identical with that of each LED. For example, the rank of each LED may be determined via a test included in the manufacturing process, and the LEDs may be classified according to the determined ranks. Accordingly, the LED array 1100 may include LEDS having the same ranks.

As illustrated in FIG. 1, the LED driving device 2000 may output to the LED array unit 1000 a current that is used for the LED array 1100 to emit light. The LED driving device 2000 may detect the signal R_SIG, corresponding to the rank information stored in the rank storing device 1200, from the terminal 1300 of the LED array unit 1000. The LED driving device 2000 may determine the rank of the LED array 1100 according to the detected signal R_SIG and may adjust the magnitude of the current provided to the LED array unit 1000 according to a result of the determination.

Figure 2:
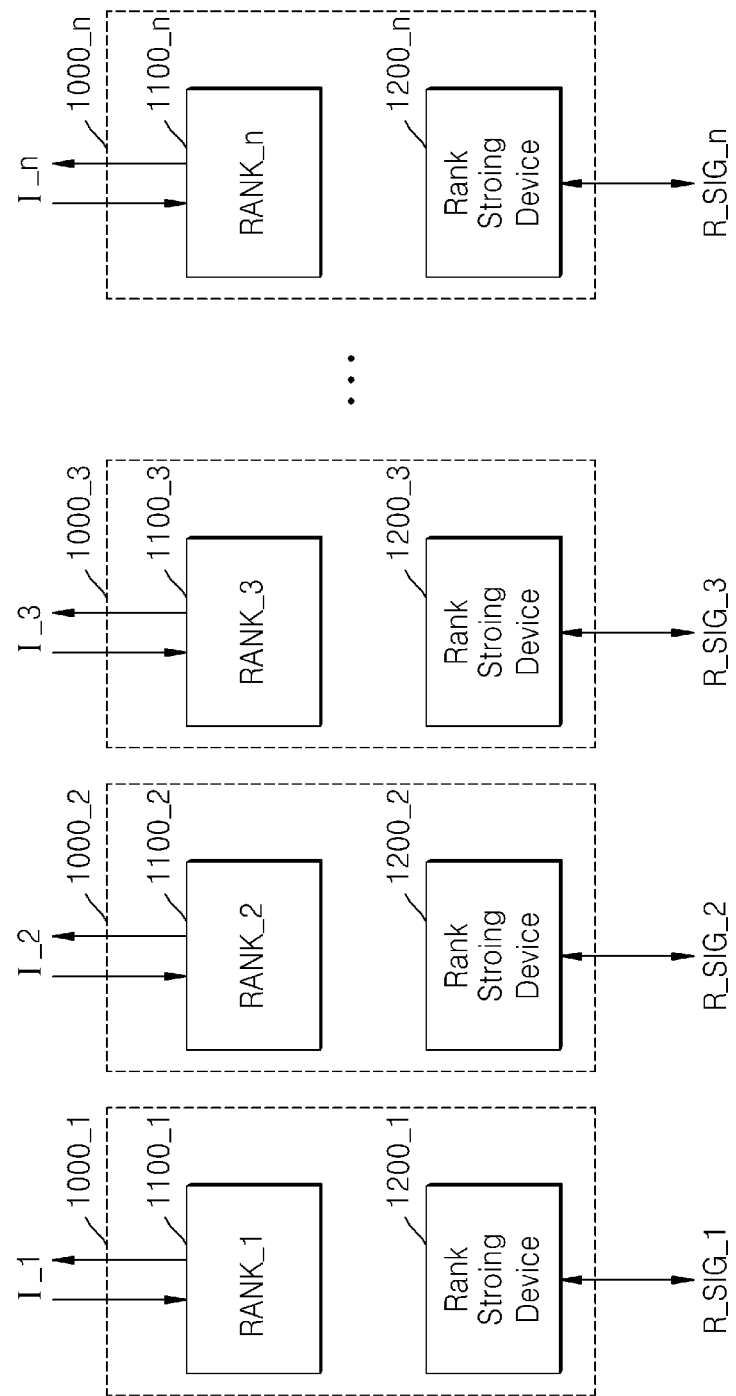
FIG. 2 is a block diagram of an LED array unit according to a rank of an LED array according to an embodiment of the present inventive concept.

FIG. 2 is a block diagram of an LED array unit according to the rank of an LED array according to an embodiment of the present inventive concept. As described above, the LED array 1100 included in the LED array unit 1000 of FIG. 1 may have a specific rank. The rank of the LED array unit 1100 may be identical with the rank of each LED included in the LED array 1100 or may be determined based on a result of a test of the LED array 1100. The rank of the LED array 1100 may be stored as the rank information in the rank storing device 1200.

As illustrated in FIG. 2, each of LED arrays 1100_1, 1100_2, ..., and 1100_n may have one of n ranks. To uniformize the intensity of light emitted by the LED arrays 1100_1, 1100_2, ..., or 1100_n each included in one of LED array units 1000_1, 1000_2, ..., and 1000_n, currents having magnitudes I_1 through I_n which are to be provided to the LED arrays 1100_1, 1100_2, ..., and 1100_n may be determined according to ranks. For example, when the LED arrays 1100_1 through 1100_n have ranks RANK_1 through RANK_n, respectively, the LED arrays 1100_1 through 1100_n may be provided with first through n-th currents I_1 through I_n, respectively, such that the LED arrays 1100_1 through 1100_n may emit light beams having the same intensity. Rank storing devices 1200_1, 1200_2, ..., 1200_n included in the respective LED array units 1000_1, 1000_2, ..., and 1000_n may store one of the n ranks as the rank information.

The LED driving device 2000 of FIG. 1 may supply a suitable current to the LED array unit 1000, according to the rank of the LED array 1000. For example, in the case of an LED array unit 1000_3 including the LED array 1100_3 with the rank RANK_3, the LED driving device 2000 may determine, according to a signal R_SIG_3 detected from the rank storing device 1200_3, that the rank of the LED array 1100_3 is RANK_3, and the LED driving device 2000 may output the third current I_3.

In general, different LED driving devices may be used to make an LED module emit constant light. For example, an LED driving device that outputs a current suitable for the rank of an LED array included in an LED array unit may be selected from a plurality of LED driving devices capable of outputting different currents to the LED array unit, and the selected LED driving device may be connected to the LED array unit, thereby manufacturing an LED module. For example, as illustrated in FIG. 2, when the rank of an LED array is one of RANK_1 through RANK_n, n LED driving devices capable of outputting the first through n-th currents I_1 through I_n, respectively, may be required. Accordingly, to manufacture an LED module according to a conventional method, a plurality of different types of LED driving devices should be prepared, and the number of LED driving devices required for a specific rank may vary according to the range of ranks that an LED array may have. In addition, inappropriate LED driving devices may be connected to the LED array unit, and thus a defective LED module may be manufactured.

Figure 6:
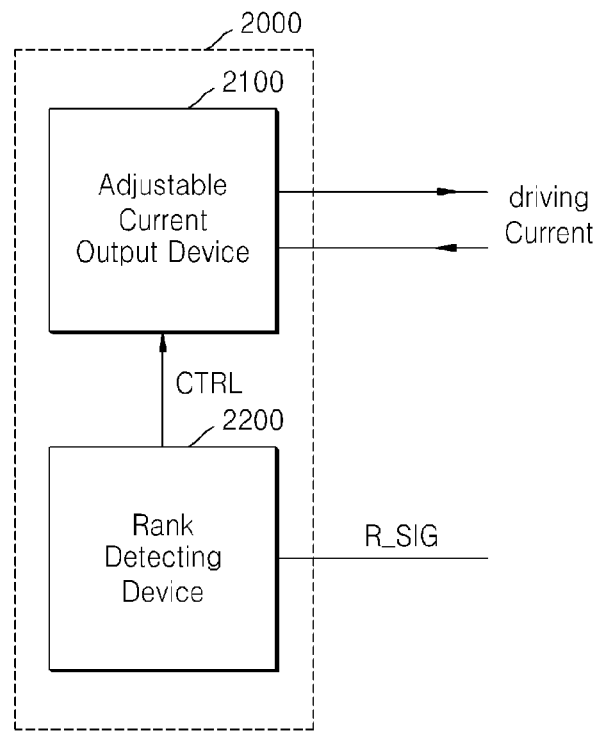
FIG. 6 is a block diagram of a LED driving device according to an embodiment of the present inventive concept.

According to an embodiment of the present inventive concept, the rank storing device 1200 of the LED array unit 1000 (see FIG. 1) may store the rank information of the LED array 1100, and a rank detecting device 2200 of FIG. 6 may determine the rank of the LED array 1100 by detecting a signal corresponding to the rank information from the rank storing device 1200, and may control an adjustable current output device 2100 of FIG. 6 to output a suitable current. Accordingly, the LED module 100 (see FIG. 1) may be manufactured using a single type of the LED driving device 2000, and thus the productivity of the LED module 100 may be increased.

Figure 3A:
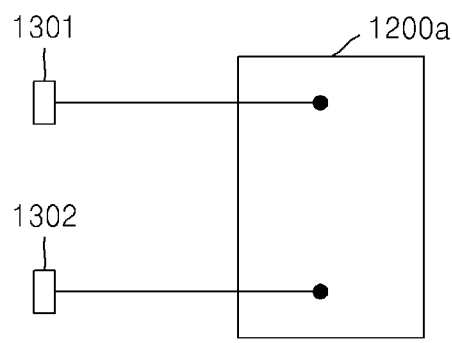
FIGS. 3A and 3B are circuit diagrams of a rank storing device according to an embodiment of the present inventive concept.
Figure 3B:
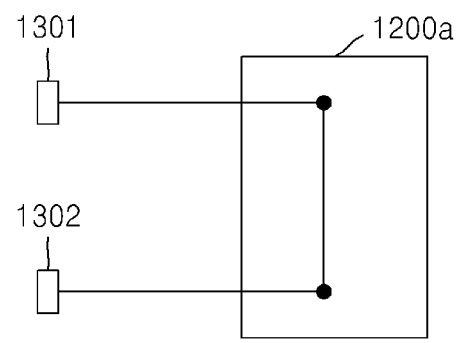
Figure 3B:
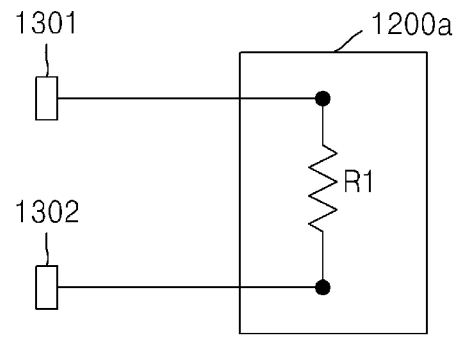

FIGS. 3A and 3B are circuit diagrams of a rank storing device 1200a according to an embodiment of the present inventive concept. As illustrated in FIGS. 3A and 3B, the rank storing device 1200a may be connected to first and second terminals 1301 and 1302 exposed to the outside of the LED array unit 1000. The rank storing device 1200a may output a signal corresponding to the rank information of the LED array 1100 to the outside of the LED array unit 1000 via the first and second terminals 1301 and 1302.

According to an embodiment of the present inventive concept, the LED array 1100 (see FIG. 1) may include one of two ranks. For example, the rank of the LED array 1100 may be 1 or 2. Accordingly, the rank storing device 1200 may store rank information representing that the rank of the LED array 1100 is 1 or 2. FIGS. 3A and 3B illustrate embodiments of the rank storing device 1200a when the rank of the LED array 1100 is 1 and when the rank of the LED array 1100 is 2, respectively.

FIG. 3A illustrates the rank storing device 1200a when the rank of the LED array 1100 is 1. As illustrated in FIG. 3A, the first and second terminals 1301 and 1302 may be opened outside the rank storing device 1200a. As the first and second terminals 1301 and 1302 are open, no current may flow between the first and second terminals 1301 and 1302. Accordingly, when the rank detecting device 2200 of FIG. 6 applies different first and second voltages to the first and second terminals 1301 and 1302, respectively, the first and second terminals 1301 and 1302 may maintain the first and second voltages, respectively, and the rank detecting device 2200 may detect the maintenance of the first or second voltage and determine that the rank of the LED array 1100 is 1.

FIG. 3B illustrates the rank storing device 1200a when the rank of the LED array 1100 is 2. As illustrated in FIG. 3B, the first and second terminals 1301 and 1302 may be shorted or may be connected to each other via a resistor R1, by the rank storing device 1200a. Accordingly, when the rank detecting device 2200 applies the different first and second voltages to the first and second terminals 1301 and 1302, respectively, a voltage that is output via the resistor R1, i.e., a higher output resistor, from among the first and second voltages may vary. Thus, the rank detecting device 2200 may detect the variation of the first or second voltage and may determine that the rank of the LED array 1100 is 2. Detailed description about the rank storing device 1200a, including the rank detecting device 2200, will be described later with reference to FIGS. 7A and 7B.

FIGS. 4A and 4B illustrate a rank storing device 1200b according to another embodiment of the present inventive concept. As illustrated in FIGS. 4A and 4B, the rank storing device 1200b may be connected to the first and second terminals 1301 and 1302, which are exposed to the outside of the LED array unit 1000 (see FIG. 1).

According to an embodiment of the present inventive concept, the rank storing device 1200b may include a resistor R1, and the resistor R1 may be connected between the first and second terminals 1301 and 1302. When the LED array 1100 has one of n ranks, the resistor R1 may have n different resistances. For example, as illustrated in FIGS. 4A and 4B, when the LED array 1100 has one of four ranks, for example, the resistor R1 may have four different resistances. In other words, when the rank of the LED array 1100 is one of 1 through 4, the resistance of the resistor R1 may be, for example, 1 k$\Omega$, 10 k$\Omega$, 100 k$\Omega$, or 1M$\Omega$. Since the resistance between the first and second terminals 1301 and 1302 varies according to the ranks of the LED array 1100, the rank detecting device 2200 may detect the resistance between the first and second terminals 1301 and 1302 and may determine the rank of the LED array 1100.

FIG. 5 is a block diagram of a rank storing device 1200c according to another embodiment of the present inventive concept. As illustrated in FIG. 5, the rank storing device 1200c may include a semiconductor memory chip 1210. The semiconductor memory chip 1210 may store the rank information of the LED array 1100 and may output the stored rank information via the terminal 1300 exposed to the outside of the LED array unit 1000. The semiconductor memory chip 1210 may be a ROM, an EEPROM, a flash memory, or the like, which is a non-volatile memory device that retains stored data even when power supply is interrupted. Although the semiconductor memory chip 1210 is connected to the outside of the LED array unit 1000 via the single terminal 1300 in FIG. 5, the semiconductor memory chip 1210 may be connected to the outside of the LED array unit 1000 via at least two terminals, depending on the type of the semiconductor memory chip 1210.

FIG. 6 is a block diagram of the LED driving device 2000 according to an embodiment of the present inventive concept. As illustrated in FIG. 1, the LED driving device 2000 may output a current to the LED array unit 1000 and may detect a signal corresponding to the rank information of the LED array 1100 from the LED array unit 1000.

As illustrated in FIG. 6, the LED driving device 2000 may include the adjustable current output device 2100 and the rank detecting device 2200. The adjustable current output device 2100 may output a current, which is used for the LED array 1100 to emit light, to the LED array unit 1000. According to an embodiment of the present inventive concept, the magnitude of the current output by the adjustable current output device 2100 may be controlled by a control signal CTRL received from the rank detecting device 2200.

According to an embodiment of the present inventive concept, the LED detecting device 2200 may detect the signal R_SIG corresponding to the rank information of the LED array 1100 from the rank storing device 1200 included in the LED array unit 1000. The LED detecting device 2200 may determine the rank of the LED array 1100 according to the detected signal R_SIG and may transmit the control signal CTRL to the adjustable current output device 2100 according to a result of the determination.

Figure 7A:
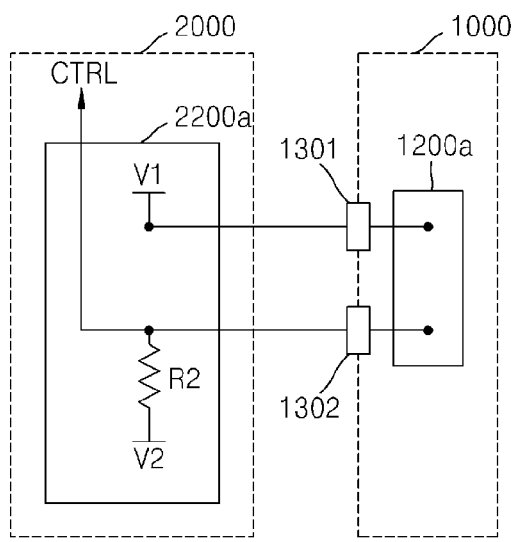
FIGS. 7A and 7B are circuit diagrams of a rank storing device and a rank detecting device according to an embodiment of the present inventive concept.
Figure 7B:
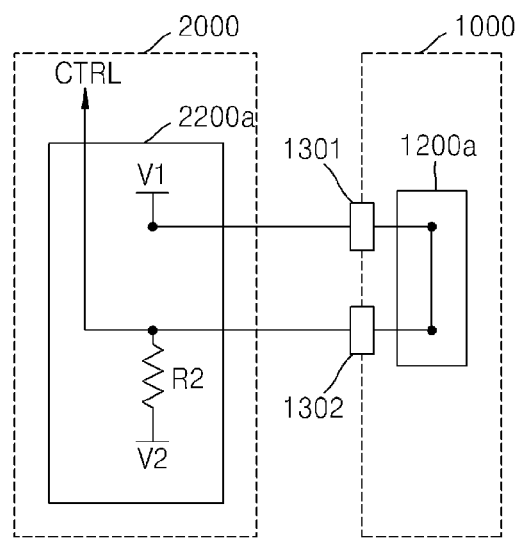

FIGS. 7A and 7B are circuit diagrams of a rank storing device 1200a and a rank detecting device 2200a according to embodiments of the present inventive concept. As illustrated in FIGS. 7A and 7B, the LED array unit 1000 may include the first and second terminals 1301 and 1302. The rank storing device 1200a may be included in the LED array unit 1000, may be connected to the first and second terminals 1301 and 1302, and may output a signal corresponding to stored rank information via the first and second terminals 1301 and 1302. As illustrated in FIGS. 7A and 7B, the rank detecting device 2200a may be included in the LED driving device 2000, may be electrically connected to the first and second terminals 1301 and 1302, and may detect the signal corresponding to the rank information stored in the rank storing device 1200a to generate the control signal CTRL, which is output to the adjustable current output device 2100 of FIG. 6.

According to an embodiment of the present inventive concept, the rank detecting device 2200a may apply first and second voltages V1 and V2 to the first and second terminals 1301 and 1302, respectively. For example, as illustrated in FIGS. 7A and 7B, the rank detecting device 2200a may directly apply the first voltage V1 to the first terminal 1301 and may apply the second voltage V2 to the second terminal 1302 via a resistor R2. In other words, the rank detecting device 2200a may output the first and second voltages V1 and V2 and may have different output resistances to output the first and second voltages V1 and V2. As shown in FIG. 7A according to an embodiment of the present inventive concept, due to the resistor R2, the output resistance of the first voltage V1 applied to the first terminal 1301 may be lower than that of the second voltage V2 applied to the second terminal 1302.

As shown in FIGS. 7A and 7B according to an embodiment of the present inventive concept, the rank storing device 1200a may be the rank storing device 1200a of FIGS. 3A and 3B. The rank storing device 1200a may store rank information by opening or shorting the first and second terminals 1301 and 1302. As illustrated in FIG. 3B, the rank storing device 1200a may connect the first and second terminals 1301 and 1302 to each other via the resistor R1, instead of shorting the first and second terminals 1301 and 1302.

FIGS. 7A and 7B illustrate embodiments of the present inventive concept, in which different pieces of rank information are stored and detected. As illustrated in FIG. 7A, the rank storing device 1200a may store the rank information representing that the rank of the LED array 1100 is 1, by opening the first and second terminals 1301 and 1302. Since the rank detecting device 2200a applies the first and second voltages V1 and V2 to the first and second terminals 1301 and 1302, respectively, the voltages of the first and second terminals 1301 and 1302 may be maintained. Accordingly, the rank detecting device 2200a may apply a voltage of the second terminal 1302, namely, the second voltage V2, as the control signal CTRL, to the adjustable current output device 2100.

As illustrated in FIG. 7B, the rank storing device 1200*a* may store the rank information representing that the rank of the LED array 1100 is 2, by shorting the first and second terminals 1301 and 1302. As illustrated in FIGS. 7A and 7B, since the output resistance of the first voltage V1 that the rank detecting device 2200*a* applies to the first terminal 1301 is lower than an output resistance of the second voltage V2 that the rank detecting device 2200*a* applies to the second terminal 1302, the rank storing device 1200*a* may short the first and second terminals 1301 and 1302, and thus the voltage of the second terminal 1302 may be the first voltage V1. Accordingly, the rank detecting device 2200*a* may apply a voltage of the second terminal 1302, namely, the first voltage V1, as the control signal CTRL, to the adjustable current output device 2100.

According to an embodiment of the present inventive concept, the first and second voltages V1 and V2 of FIGS. 7A and 7B, which are different, may be a power supply voltage and a ground voltage of the LED driving device 2000. The resistor R2 may be used to increase the output resistance of the second voltage V2, and may be replaced with the other devices capable of increasing an output resistance, for example, with a transistor or the like.

Figure 8:
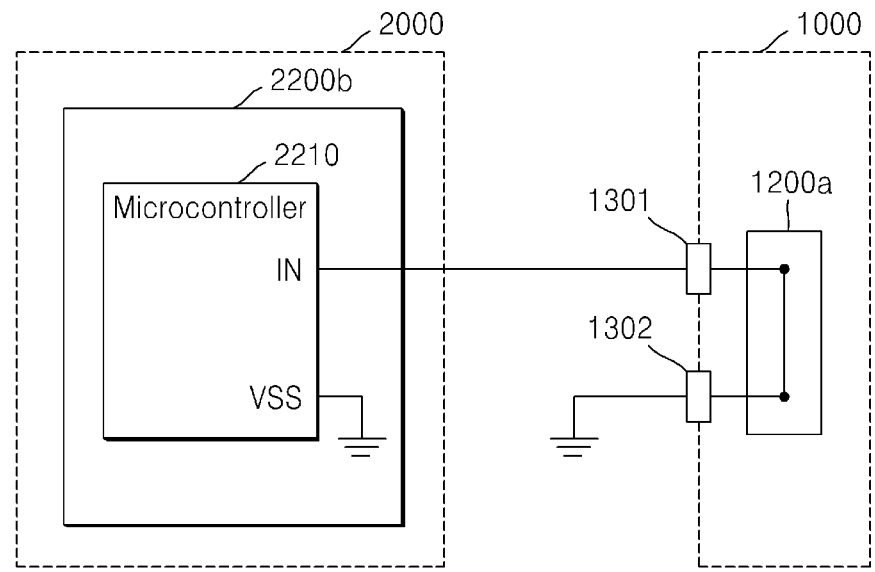
FIG. 8 is a circuit diagram of a rank storing device and a rank detecting device according to an embodiment of the inventive concept.

FIG. 8 is a circuit diagram of a rank storing device 1200*a* and a rank detecting device 2200*b* according to an embodiment of the present inventive concept. As illustrated in FIG. 8, the LED array unit 1000 may include the first and second terminals 1301 and 1302, and the rank storing device 1200*a* may output a signal corresponding to stored rank information to the LED driving device 2000 via the first and second terminals 1301 and 1302.

As illustrated in FIG. 8, the rank detecting device 2200*b* may be included in the LED driving device 2000, and may include a microcontroller 2210. The microcontroller 2210, which is a device that performs predefined instructions, may include an input port IN and a terminal VSS, which may be grounded. The microcontroller 2210 may receive a signal according to a voltage at the input port IN. According to an embodiment of the present inventive concept, the input port IN of the microcontroller 2210 may be connected to the first terminal 1301 of the LED array unit 1000, and the second terminal 1302 of the LED array unit 1000 may be grounded.

As shown in FIG. 8, according to an embodiment of the present inventive concept, the rank storing device 1200*a* may be the rank storing device 1200*a* of FIGS. 3A and 3B. The rank storing device 1200*a* may store rank information by opening or shorting the first and second terminals 1301 and 1302. As illustrated in FIG. 3B, the rank storing device 1200*a* may connect the first and second terminals 1301 and 1302 to each other via the resistor R1, instead of shorting the first and second terminals 1301 and 1302.

As the rank storing device 1200*a* opens or shorts the first and second terminals 1301 and 1302, a voltage applied to the input port IN of the microcontroller 2210 may be an open voltage of the input port IN or a ground voltage. The open voltage of the input port IN may be identical with a power supply voltage of the microcontroller 2210. For example, when the input port IN is connected to a power supply voltage via a pull-up resistor and thus no voltages are applied from an external source to the input port IN, the voltage of the input port IN may be the power supply voltage. Although not illustrated in FIG. 8, the pull-up resistor may be included in the microcontroller 2210 or may be provided outside the microcontroller 2210. For example, the pull-up resistor may be provided in the rank detecting device 2200*b* or in the rank storing device 1200*a*.

As illustrated in FIG. 8, when the rank storing device 1200*a* opens the first and second terminals 1301 and 1302 to store the rank information representing that the rank of the LED array 1100 is 1, the voltage of the input device IN of the microcontroller 2210 may be a power supply voltage. Thus, the microcontroller 2210 may detect that the voltage of the input port IN is a high level, and thus may determine that the rank of the LED array 1100 is 1.

As illustrated in FIG. 3B, when the rank storing device 1200*a* shorts the first and second terminals 1301 and 1302 or connect them together via the resistor R1 in order to store the rank information representing that the rank of the LED array 1100 is 2, the voltage of the input device IN of the microcontroller 2210 may be a ground voltage or a voltage approximate to the ground voltage. Thus, the microcontroller 2210 may detect that the voltage of the input port IN is in a low level, and thus may determine that the rank of the LED array 1100 is 2.

According to an embodiment of the present inventive concept, the microcontroller 2210 may transmit the control signal CTRL to the adjustable current output device 2100 according to the rank of the LED array 1100 determined from the input port IN. Although the microcontroller 2210 and the rank storing device 1200*a* are connected to each other via the single terminal 1301 in FIG. 8, embodiments of the present inventive concept are not limited thereto. For example, the microcontroller 2210 may include at least two input ports IN, and the rank storing device 1200*a* may output rank information via at least two terminals connected to the input ports IN of the microcontroller 2210. When the number of input ports IN (or terminals) via which the rank storing device 1200*a* is connected to the microcontroller 2210 is n, the number of types of LED arrays 1100 that can be stored in the rank storing device 1200*a* and detected by the microcontroller 2210 may be up to $2^n$.

Figure 9A:
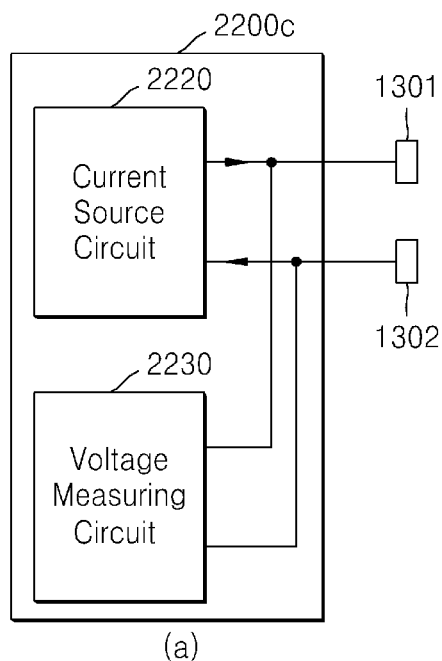
FIGS. 9A and 9B illustrate rank detecting devices according to embodiments of the present inventive concept.
Figure 9B:
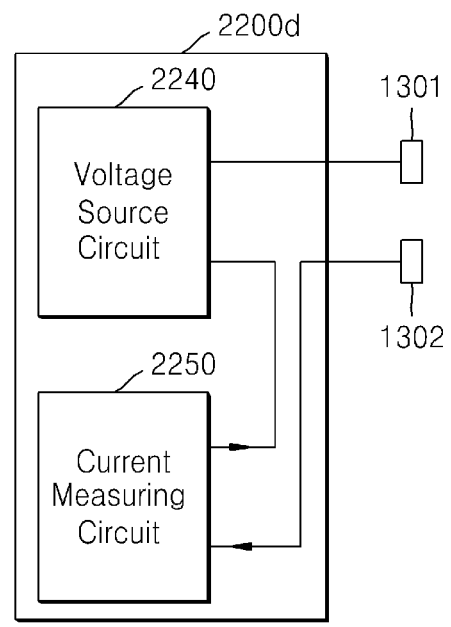

FIGS. 9A and 9B illustrate rank detecting devices 2200*c* and 2200*d* according to embodiments of the present inventive concept. As described above with reference to FIGS. 4A and 4B, the rank storing device 1200*b* included in the LED array unit 1000 may include the resistor R1, and the resistor R1 may be connected between the first and second terminals 1301 and 1302, which are exposed to the outside of the LED array unit 1000. The resistance of the resistor R1 may be determined according to the rank of the LED array unit 1000. As illustrated in FIGS. 9A and 9B, the rank detecting devices 2200*c* and 2200*d* may be each connected to the first and second terminals 1301 and 1302, and may each detect the resistance between the first and second terminals 1301 and 1302 to determine the rank of the LED array 1100.

FIG. 9A illustrates the rank detecting device 2200*c* according to an embodiment of the present inventive concept. As illustrated in FIG. 9A, the rank detecting device 2200*c* may include a current source circuit 2220 and a voltage measuring circuit 2230. The current source circuit 2220 and the current measuring circuit 2230 may be electrically connected to the first and second terminals 1301 and 1302. The current source circuit 2220 may output a direct current (DC) with a constant magnitude. The voltage measuring circuit 2230 may measure a voltage between two nodes, and may include an analog-to-digital converter (ADC).

According to an embodiment of the present inventive concept, the current source circuit 2200 may supply a current with a constant magnitude via the first terminal 1301, and the voltage measuring circuit 2230 may measure a voltage between the first and second terminals 1301 and 1302. The voltage measured by the voltage measuring circuit 2230 may increase in proportion to the resistance of the resistor R1 included in the rank storing device 1200b. Accordingly, according to the magnitude of the voltage between the first and second terminals 1301 and 1302 measured by the voltage measuring circuit 2230, the rank detecting device 2200 may detect the resistance of the resistor R1 and consequently may determine the rank of the LED array 1100. For example, when the LED array 1100 and the resistor R1 are in a relationship as shown in FIG. 4B and the voltage measuring circuit 2230 detects the resistance of the resistor R1 as being 10 kΩ, the rank detecting device 2200c may determine that the rank of the LED array 1100 is 2.

FIG. 9B illustrates the rank detecting device 2200d according to an embodiment of the present inventive concept. As illustrated in FIG. 9B, the rank detecting device 2200d may include a voltage source circuit 2240 and a current measuring circuit 2250. The voltage source circuit 2240 and the current measuring circuit 2250 may be serially connected to each other between the first and second terminals 1301 and 1302. A voltage provided by the voltage source circuit 2240 may pass through the current measuring circuit 2250 and may be output as a DC voltage with a constant magnitude between the first and second terminals 1301 and 1302. The current measuring circuit 2250 may be serially connected to the first or second terminal 1301 or 1302 and may measure a current. The current measured by the current measuring circuit 2250 may decrease in proportion to the resistance of the resistor R1 included in the rank storing device 1200b. Accordingly, according to the magnitude of the current measured by the current measuring circuit 2250, the rank detecting device 2200d may detect the resistance of the resistor R1 and consequently may determine the rank of the LED array 1100.

Figure 10:
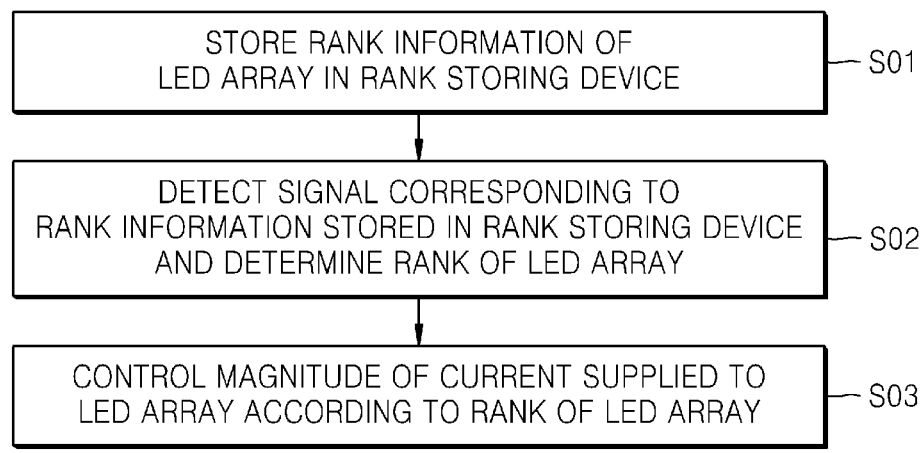
FIG. 10 is a flowchart of a method of controlling an LED module, according to an embodiment of the present inventive concept.

FIG. 10 is a flowchart of a method of controlling the LED module 100 of FIG. 1, according to an embodiment of the present inventive concept. As described above with reference to FIG. 1, the LED array unit 1000 and the LED driving device 2000 may be manufactured as separate modules and may be assembled into the LED module 100 and connected to each other.

According to an embodiment of the present inventive concept, the LED array unit 1000 may include the LED array 1100 and the rank storing device 1200. In operation S01, the rank storing device 1200 may store rank information of the LED array 1100. The storing of the rank information in the rank storing device 1200 may be performed during the manufacture of the LED array unit 1000. As an example, when the ranks of the LEDs included in the LED array 1100 are all the same, the rank storing device 1200 may store rank information of the LEDs. As another example, the rank of the LED array 1100 may be determined based on a result of a test, and the rank storing device 1200 may store information about the determined rank of the LED array 1100.

According to an embodiment of the present inventive concept, the LED driving device 2000 may include the adjustable current output device 2100 and the rank detecting device 2200. In operation S02, the LED detecting device 2200 may detect the signal R_SIG corresponding to the rank information stored in the rank storing device 1200 and determine the rank of the LED array 1100. In operation S03, the rank detecting device 2200 may control the magnitude of the current supplied to the LED array 1100 included in the LED array unit 1000, by controlling the adjustable current output device 2100 according to the rank of the LED array 1100. Consequently, the LED module 100 may emit constant light regardless of the characteristics of the LEDs included in the LED array 1100.

Figure 11:
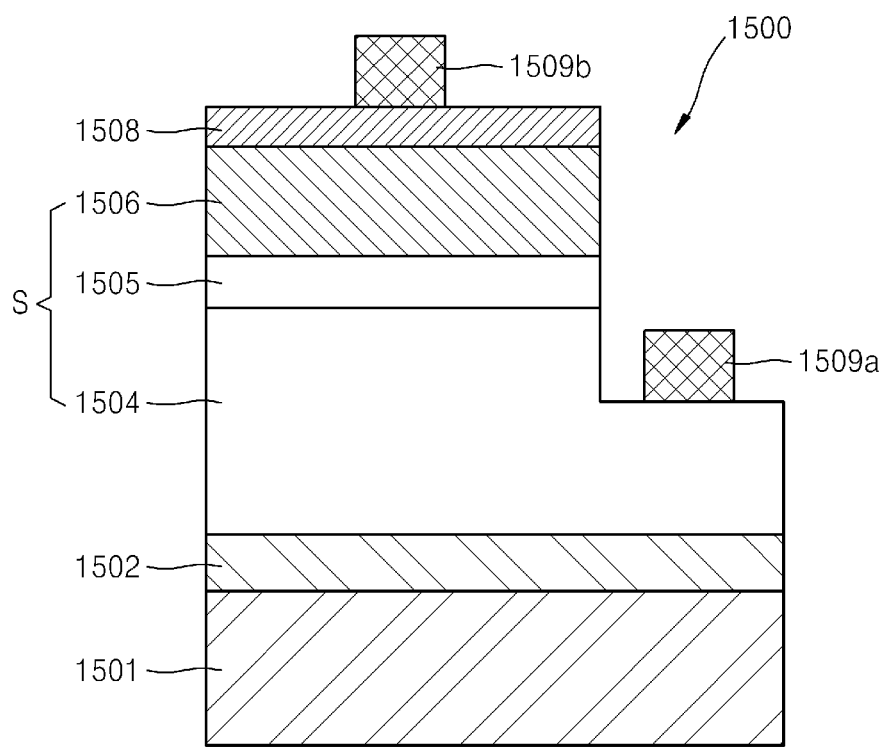
FIG. 11 is a cross-sectional side view illustrating an LED chip that may be used in a light-emitting device package module, according to an embodiment of the present inventive concept.

FIG. 11 is a cross-sectional side view illustrating an LED chip 1500 that may be used in an LED array, according to an embodiment of the present inventive concept. As illustrated in FIG. 11, the LED chip 1500 may include an emission stack S that is formed on a substrate 1501. The emission stack S may include a first conductive semiconductor layer 1504, an active layer 1505, and a second conductive semiconductor layer 1506.

Also, an ohmic electrode layer 1508 may be formed on the second conductive semiconductor layer 1506, and a first electrode 1509a and a second electrode 1509b may be formed on top surfaces of the first conductive semiconductor layer 1504 and the ohmic contact layer 1508, respectively.

Throughout the specification, terms such as 'upper', 'top surface', 'lower', 'bottom surface', 'side surface', or the like are based on drawings; thus, they may be changed according to a direction in which a device is actually disposed.

Hereinafter, elements of the LED chip 1500 are described in detail.

The substrate 1501 may be an insulating substrate, a conductive substrate, or a semiconductor substrate. For example, the substrate 1501 may be formed of sapphire, SiC, Si, $MgAl_2O_4$, MgO, $LiAlO_2$, $LiGaO_2$, or GaN. A sapphire substrate, a silicon carbide (SiC) substrate, or the like, which is an example of a heterogeneous substrate, may be used as the substrate 1501. When the heterogeneous substrate is used, a defect such as dislocation or the like may be increased due to a difference between lattice constants of a substrate material and a thin-film material. Also, due to a difference between thermal expansion coefficients of the substrate material and the thin-film material, the substrate 1501 may be bent when a temperature is changed, and the bend may cause a crack of a thin-film. The aforementioned problem may be decreased by using a buffer layer 1502 between the substrate 1501 and the emission stack S, which may be formed of a GaN-based material.

The buffer layer 1502 may be formed of $Al_xIn_yGa_{(1-x-y)}N$ (0≤x≤1, 0≤y≤1), in particular, GaN, AlN, AlGaN, InGaN, or InGaNAlN, and the buffer layer 1502 may be formed of ZrB2, HfB2, ZrN, HfN, TiN, or the like. Also, the buffer layer 1502 may be formed by combining a plurality of layers or by gradually varying composition of one of the aforementioned materials.

Each of the first and second conductive semiconductor layers 1504 and 1506 may have a single-layer structure. However, each of the first and second conductive semiconductor layers 1504 and 1506 may have a multi-layer structure including a plurality of layers having different compositions or thicknesses. For example, each of the first and second conductive semiconductor layers 1504 and 1506 may have a carrier injection layer capable of improving an efficiency of electron and hole injection, and may also have a superlattice structure having various forms.

The first conductive semiconductor layer 1504 may further include a current diffusion layer (not separately shown) that is adjacent to the active layer 1505. The current diffusion layer may have a structure in which a plurality of $In_xAl_yGa_{(1-x-y)}N$ layers having different compositions or different impurity ratios are repeatedly stacked, or may be partially formed of an insulation material layer.

The second conductive semiconductor layer 1506 may further include an electron block layer (not separately shown) that is adjacent to the active layer 1505. The electron block layer may have a structure in which a plurality of $In_xAl_yGa_{(1-x-y)}N$ layers having different compositions are stacked or may have at least one layer formed of $Al_yGa_{(1-y)}N$. Since the electron block layer has a larger bandgap than the active layer

1505, the electron block layer prevents electrons from entering into the second conductive semiconductor layer 1506 (that may be a p-type).

The emission stack S may be formed by using a metal organic chemical vapor deposition (MOCVD) apparatus. In more detail, a reaction gas such as an organic metal compound gas (e.g., trimethyl gallium (TMG), trimethyl aluminum (TMA), or the like) and a nitrogen containing gas (e.g., ammonia ($NH_3$), or the like) may be injected into a reaction container in which the substrate 1501 is arranged, and the substrate 1501 may be maintained at a high temperature of about 900 through 1100 degrees. While a gallium nitride-based compound semiconductor is being grown on the substrate 1501, an impurity gas may be injected, so that the gallium nitride-based compound semiconductor is stacked as an undoped-type, an n-type, or a p-type. In this way, the emission stack S may be formed. Si is well known as n-type impurity. Zn, Cd, Be, Mg, Ca, Ba, or the like, in particular, Mg and Zn, may be used as p-type impurity.

The active layer 1505 disposed between the first and second conductive semiconductor layers 1504 and 1506 may have a multi-quantum well (MQW) structure in which a quantum well layer and a quantum barrier layer are alternately stacked. For example, in a case of a nitride semiconductor, the active layer 1505 may have a GaN/InGaN structure. However, in another embodiment of the present inventive concept, the active layer 1505 may have a single-quantum well (SQW) structure.

The ohmic electrode layer 1508 may have high impurity density and thus low ohmic contact resistance, so that a device operating voltage may be decreased and the device characteristic may be improved. The ohmic electrode layer 1508 may be formed of GaN, InGaN, ZnO, or a graphene layer.

The first electrode 1509a or the second electrode 1509b may include a material such as Ag, Ni, Al, Rh, Pd, Ir, Ru, Mg, Zn, Pt, Au, or the like, or may have a multi-layer structure including Ni/Ag, Zn/Ag, Ni/Al, Zn/Al, Pd/Ag, Pd/Al, Ir/Ag, Ir/Au, Pt/Ag, Pt/Al, Ni/Ag/Pt, or the like.

While the LED chip 1500 shown in FIG. 11 has a structure in which the first electrode 1509a, the second electrode 1509b, and a light extraction surface face the same side, the LED chip 1500 may have various structures such as a flip-chip structure in which the first electrode 1509a and the second electrode 1509b face the opposite side of the light extraction surface, a vertical structure in which the first electrode 1509a and the second electrode 1509b are formed on opposite surfaces, and a vertical and horizontal structure employing an electrode structure in which a plurality of vias are formed in a chip so as to increase efficiency of current distribution and heat dissipation.

Figure 12:
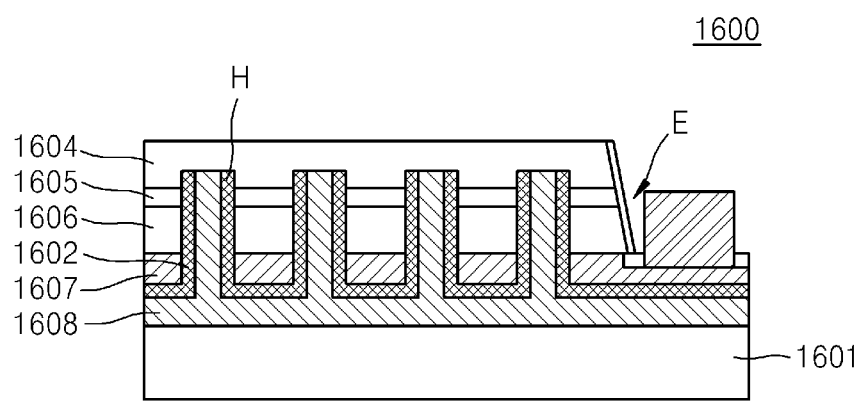
FIG. 12 is a cross-sectional side view illustrating an LED chip that may be used in a light-emitting device package module, according to another embodiment of the present inventive concept.

FIG. 12 is a cross-sectional side view illustrating an LED chip 1600 that may be used in an LED array, according to another embodiment of the present inventive concept. When a large area LED chip for a high output is manufactured for use in lighting apparatuses, the LED chip 1600 having a structure useful for increasing efficiency of current distribution and heat dissipation may be used.

As illustrated in FIG. 12, the LED chip 1600 may include a first conductive semiconductor layer 1604, an active layer 1605, a second conductive semiconductor layer 1606, a second electrode layer 1607, an insulating layer 1602, a first electrode layer 1608, and a substrate 1601, which are sequentially stacked. Here, in order to be electrically connected to the first conductive semiconductor layer 1604, the first electrode layer 1608 may include one or more contact holes H that are electrically insulated from the second conductive semiconductor layer 1606 and the active layer 1605 and that extend from a surface of the first electrode layer 1608 to at least a portion of the first conductive semiconductor layer 1604.

The contact hole H may extend from an interface of the first electrode layer 1608 to the inside of the first conductive semiconductor layer 1604 via the second conductive semiconductor layer 1606 and the active layer 1605. The contact hole H may extend to at least an interface between the active layer 1605 and the first conductive semiconductor layer 1604. The contact hole H may extend to even a portion of the first conductive semiconductor layer 1604. Since the contact hole H functions to form electrical connection to and distribute a current of the first conductive semiconductor layer 1604, the contact hole H may achieve its purpose when the contact hole H contacts the first conductive semiconductor layer 1604; thus, the contact hole may not extend to even an outer surface of the first conductive semiconductor layer 1604.

The second electrode layer 1607 that is formed on the second conductive semiconductor layer 1606 may be formed of a material selected from Ag, Ni, Al, Rh, Pd, Ir, Ru, Mg, Zn, Pt, and Au, in consideration of a light reflection function and an ohmic contact with the second conductive semiconductor layer 1606, and may be formed via a sputtering process or a deposition process.

The contact hole H may have a shape that penetrates through the second electrode layer 1607, the second conductive semiconductor layer 1606, and the active layer 1605 so as to be connected with the first conductive semiconductor layer 1604. The contact hole H may be formed via an etching process, for example, ICP-RIE or the like.

The insulating layer 1602 may be formed to cover side walls of the contact hole H and a top surface of the second conductive semiconductor layer 1606. In this case, at least a portion of the first conductive semiconductor layer 1604 that corresponds to a bottom surface of the contact hole H may be exposed. The insulating layer 1602 may be formed by depositing an insulation material such as $SiO_2$, $SiO_xN_y$, $Si_xN_y$, or the like.

The first electrode layer 1608 that includes a conductive via formed by filling a conductive material may be formed in the contact hole H. Afterward, the substrate 1601 may be formed on the first electrode layer 1608. In this structure, the substrate 1601 may be electrically connected to the first conductive semiconductor layer 1604 via the conductive via that contacts the first conductive semiconductor layer 1604.

The substrate 1601 may be formed of, but is not limited to, a material selected from Au, Ni, Al, Cu, W, Si, Se, GaAs, SiAl, Ge, SiC, AlN, $Al_2O_3$, GaN, and AlGaN, via a plating process, a sputtering process, a deposition process, or an adhesion process.

In order to decrease a contact resistance of the contact hole H, a total number of the contact holes H, a shape of the contact hole H, a pitch of the contact hole H, a contact area of the contact hole H with respect to the first and second conductive semiconductor layers 1604 and 1606, or the like may be appropriately adjusted. Since the contact holes H are arrayed in various forms along lines and columns, a current flow may be improved.

An LED lighting apparatus may provide an improved heat dissipation characteristic, but an LED chip having a small heating value may be used as an LED chip for use in the LED lighting apparatus, in consideration of a total heat dissipation performance. An example of the LED chip may be an LED chip having a nano structure (hereinafter, referred to as a "nano LED chip").

An example of the nano LED chip may include a core-shell type nano LED chip that has recently been developed. The core-shell type nano LED chip may generate a relatively small amount of heat due to its small combined density, and increase its emission area by using the nano structure so as to increase emission efficiency. Also, the core-shell type nano LED chip may obtain a non-polar active layer, thereby preventing efficiency deterioration due to polarization, so that a drop characteristic may be improved.

Figure 13:
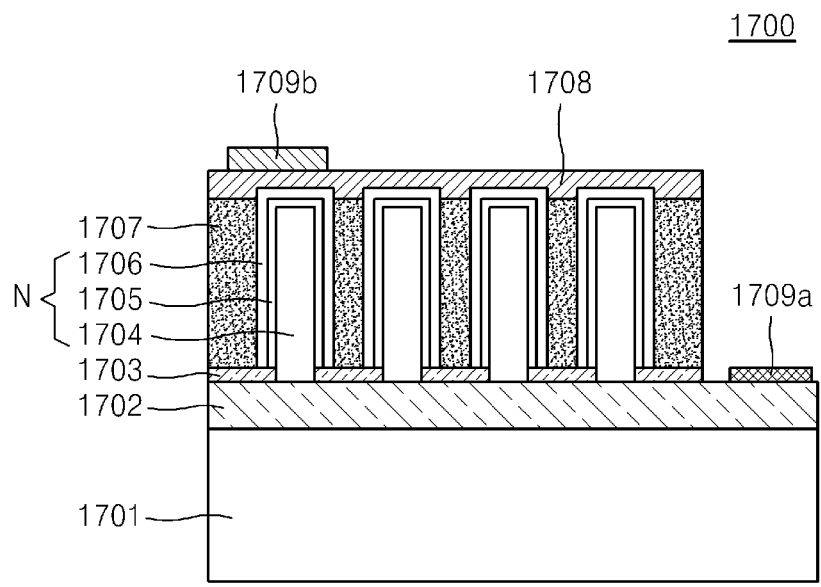
FIG. 13 is a cross-sectional side view illustrating an LED chip that may be used in a light-emitting device package module, according to another embodiment of the present inventive concept.

FIG. 13 is a cross-sectional side view illustrating a nano LED chip 1700 that may be used in an LED array, according to another embodiment of the present inventive concept. As illustrated in FIG. 13, the nano LED chip 1700 may include a plurality of nano emission structures N that are formed on a substrate 1701. In an embodiment of the present inventive concept, the nano emission structure N may have a rod structure as a core-shell structure, but in another embodiment of the present inventive concept, the nano emission structure N may have a different structure such as a pyramid structure.

The nano LED chip 1700 may include a base layer 1702 formed on the substrate 1701. The base layer 1702 may be a layer that provides a growth surface for the nano emission structure N and may be formed of a first conductive semiconductor. A mask layer 1703 having open areas for a growth of the nano emission structures N (in particular, a core) may be formed on the base layer 1702. The mask layer 1703 may be formed of a dielectric material such as $SiO_2$ or $SiN_x$.

In the nano emission structure N, a first conductive nano core 1704 may be formed by selectively growing the first conductive semiconductor by using the mask layer 1703 having open areas. An active layer 1705 and a second conductive semiconductor layer 1706 may be formed as a shell layer on a surface of the first conductive nano core 1704. By doing so, the nano emission structure N may have a core-shell structure in which the first conductive semiconductor is a nano core, and the active layer 1705 and the second conductive semiconductor layer 1706 that surround the nano core are the shell layer.

In an embodiment of the present inventive concept, the nano LED chip 1700 may include a filling material 1707 that fills gaps between the nano emission structures N. The filling material 1707 may structurally stabilize the nano emission structures N. The filling material 1707 may include, but is not limited to, a transparent material such as $SiO_2$. An ohmic contact layer 1708 may be formed on the nano emission structure N so as to contact the second conductive semiconductor layer 1706. The nano LED chip 1700 may include the base layer 1702 formed of a first conductive semiconductor, and first and second electrodes 1709a and 1709b connected to the ohmic contact layer 1708.

By varying a diameter, a component, or a doping density of the nano emission structure N, light beams having at least two different wavelengths may be emitted from one device. By appropriately adjusting the light beams having the different wavelengths, white light may be realized in the one device without using a phosphor. In addition, by combining the one device with another LED chip or combining the one device with a wavelength conversion material such as a phosphor, light beams having desired various colors or white light beams having different color temperatures may be realized.

Figure 14:
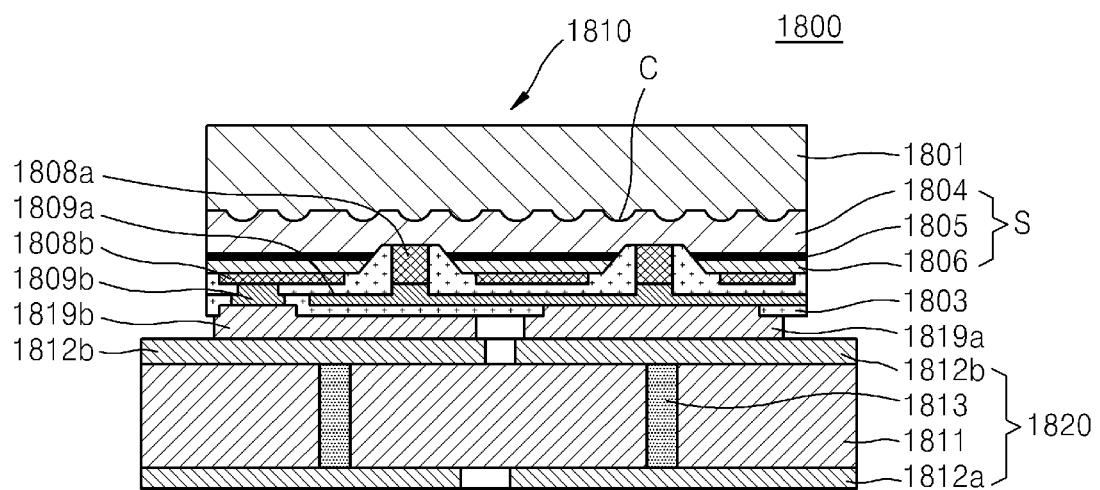
FIG. 14 illustrates a semiconductor light-emitting device that includes an LED chip mounted at a substrate and that may be used in a light-emitting device package module, according to an embodiment of the present inventive concept.

As shown in FIG. 14, a semiconductor LED 1800 may include an LED chip 1810 mounted on a mounting substrate 1820 and may be used in an LED array, according to an embodiment of the present inventive concept. The semiconductor LED 1800 shown in FIG. 14 may include the mounting substrate 1820 and the LED chip 1810, which is mounted on the mounting substrate 1820. The LED chip 1810 may be different from the LED chips in the aforementioned embodiments of the present inventive concept.

The LED chip 1810 may include an emission stack S that is disposed on a surface of the substrate 1801, and first and second electrodes 1808a and 1808b that are disposed on a surface of the emission stack S opposite to the substrate 1801. Also, the LED chip 1810 may include an insulation layer 1803 to cover the first and second electrodes 1808a and 1808b.

The first and second electrodes 1808a and 1808b may include first and second electrode pads 1819a and 1819b via first and second electric power connectors 1809a and 1809b.

The emission stack S may include a first conductive semiconductor layer 1804, an active layer 1805, and a second conductive semiconductor layer 1806 that are sequentially disposed on the substrate 1801. The first electrode 1808a may be provided as a conductive via that contacts the first conductive semiconductor layer 1804 by penetrating through the second conductive semiconductor layer 1806 and the active layer 1805. The second electrode 1808b may be connected to the second conductive semiconductor layer 1806.

The insulation layer 1803 may have an open area to expose at least a portion of the first and second electrodes 1808a and 1808b. The first and second electrode pads 1819a and 1819b may contact the first and second electrodes 1808a and 1808b.

The first and second electrodes 1808a and 1808b may have a single-layer structure or a multi-layer structure formed of the first and second conductive semiconductor layers 1804 and 1806, respectively, and a conductive material having ohmic characteristic. For example, the first and second electrodes 1808a and 1808b may be formed by depositing or sputtering at least one material selected from the group consisting of Ag, Al, Ni, Cr, and transparent conductive oxide (TCO). The first and second electrodes 1808a and 1808b may be disposed in the same direction, and as will be described later. The first and second electrodes 1808a and 1808b may be mounted in the form of a flip-chip in a lead frame. In this case, the first and second electrodes 1808a and 1808b may be disposed to face in the same direction.

In particular, the first electric power connector 1809a may be formed by the first electrode 1808a, namely, by the conductive via that penetrates through the second conductive semiconductor layer 1806 and the active layer 1805 and then is connected to the first conductive semiconductor layer 1804 in the emission stack S.

In order to decrease a contact resistance between the conductive via and the first electric power connector 1809a, a total number, shapes, pitches, a contact area with the first conductive semiconductor layer 1804, or the like, of the conductive via and the first electric power connector 1809a may be appropriately adjusted. Since the conductive via and the first electric power connector 1809a are arrayed in rows and columns, a current flow may be improved.

An electrode structure of the other side of the semiconductor LED 1800 may include the second electrode 1808b that is directly formed on the second conductive semiconductor layer 1806, and the second electric power connector 1809b that is formed on the second electrode 1808b. The second electrode 1808b may function to form an electrical ohmic contact with the second electric power connector 1809b and may be formed of a light reflection material, so that, when the LED chip 1810 is mounted as a flip-chip structure as illustrated in FIG. 14, the second electrode 1808b may efficiently discharge light, which is emitted from the active layer 1805, toward the substrate 1801. According to a direction in which light is mainly directed, the second electrode 1808b may be formed of a light-transmitting conductive material such as transparent conductive oxide.

The aforementioned two electrode structures may be electrically separated from each other by using the insulation layer 1803. Any material or any object having an electrical insulation property may be used as the insulation layer 1803, but it is preferable to use a material having a low light-absorption property. For example, silicon oxide or silicon nitride such as $SiO_2$, $SiO_xN_y$, $Si_xN_y$, or the like may be used. The insulation layer 1803 may have a light reflection structure in which a light reflective filler is distributed throughout a light transmitting material.

The first and second electrode pads 1819*a* and 1819*b* may be connected to the first and second electric power connectors 1809*a* and 1809*b*, respectively, and thus may function as external terminals of the LED chip 1810. For example, the first and second electrode pads 1819*a* and 1819*b* may be formed of Au, Ag, Al, Ti, W, Cu, Sn, Ni, Pt, Cr, NiSn, TiW, AuSn, or an eutectic alloy thereof. In this case, when the first and second electrode pads 1819*a* and 1819*b* are mounted on the mounting substrate 1820, the first and second electrode pads 1819*a* and 1819*b* may be bonded to the mounting substrate 1820 by using an eutectic metal, so that a separate solder bump that is generally used in flip-chip bonding does not have to be used. Compared to a case of using the solder bump, the mounting method using the eutectic metal may achieve a more excellent heat dissipation effect. In this case, in order to obtain the excellent heat dissipation effect, the first and second electrode pads 1819*a* and 1819*b* may be formed while having large areas.

The substrate 1801 and the emission stack S may be understood by referring to the description with reference to FIG. 11, unless contrary description is provided. Also, although not particularly illustrated in FIG. 14, a buffer layer (not separately shown) may be formed between the emission stack S and the substrate 1801, and in this regard, the buffer layer may be formed as an undoped semiconductor layer including nitride or the like, so that the buffer layer may decrease a lattice defect of an emission structure that is grown on the buffer layer.

The substrate 1801 may have first and second primary surfaces that face each other, and in this regard, a convex-concave structure may be formed on at least one of the first and second primary surfaces. The convex-concave structure that is arranged on one surface of the substrate 1801 may be formed of the same material as the substrate 1801 since a portion of the substrate 1801 is etched, or may be formed of a different material from the substrate 1801.

As in an embodiment of the present inventive concept, since the convex-concave structure is formed at an interface between the substrate 1801 and the first conductive semiconductor layer 1804, a path of light emitted from the active layer 1805 may vary, such that a rate of light that is absorbed by the semiconductor layer may be decreased and a light-scattering rate may be increased; thus, the light extraction efficiency may be increased.

In more detail, the convex-concave structure may have a regular shape or an irregular shape. Heterogeneous materials that form the convex-concave structure may include a transparent conductor, a transparent insulator, or a material having excellent reflectivity. The transparent insulator may include, but is not limited to, $SiO_2$, $SiN_x$, $Al_2O_3$, HfO, $TiO_2$ or ZrO. The transparent conductor may include, but is not limited to, TCO such as indium oxide containing ZnO or an additive including Mg, Ag, Zn, Sc, Hf, Zr, Te, Se, Ta, W, Nb, Cu, Si, Ni, Co, Mo, Cr, or Sn. The reflective material may include, but is not limited to, Ag, Al, or DBR that is formed of a plurality of layers having different refractive indexes.

The substrate 1801 may be removed from the first conductive semiconductor layer 1804. In order to remove the substrate 1801, a laser lift off (LLO) process using a laser, an etching process, or a polishing process may be performed. After the substrate 1801 is removed, the convex-concave structure may be formed on a top surface of the first conductive semiconductor layer 1804.

As illustrated in FIG. 14, the LED chip 1810 may be mounted on the mounting substrate 1820. The mounting substrate 1820 may have a structure in which upper and lower electrode layers 1812*b* and 1812*a* are formed on a top surface and a bottom surface of a substrate body 1811, respectively, and a via 1813 penetrates through the substrate body 1811 so as to connect the upper and lower electrode layers 1812*b* and 1812*a*. The substrate body 1811 may be formed of resin, ceramic, or metal. The upper and lower electrode layers 1812*b* and 1812*a* may be metal layers including Au, Cu, Ag, Al, or the like.

An example of a substrate on which the LED chip 1810 is mounted is not limited to the mounting substrate 1820 of FIG. 14, and thus any substrate having a wiring structure to drive the LED chip 1810 may be used. For example, it is possible to provide a package structure in which the LED chip 1810 is mounted in a package body having a pair of lead frames.

An LED chip having one of various structures may be used, other than the aforementioned LED chips. For example, it is possible to use an LED chip having light extraction efficiency that is significantly improved by interacting a quantum well excitation with surface-plasmon polaritons (SPP) formed at an interface between metal and dielectric layers of the LED chip.

The aforementioned various LED chips may be mounted as bare chips on a circuit board and then may be used in the aforementioned LED array. However, the LED chips may also alternatively be used in various package structures that are mounted in a package body having a pair of electrode structures.

A package including the LED chip (hereinafter, referred to as an LED package) may have not only an external terminal structure that is easily connected to an external circuit, but also may have a heat dissipation structure for improvement of a heat dissipation characteristic of the LED chip and various optical structures for improvement of a light characteristic of the LED chip. For example, the various optical structures may include a wavelength conversion layer that converts light emitted from the LED chip into light having a different wavelength, or may include a lens structure for improvement of a light distribution characteristic of the LED chip.

The example of the LED package that may be used in the lighting apparatus may include an LED chip package having a chip scale package (CSP) structure.

The CSP may reduce a size of the LED chip package, may simplify the manufacturing procedure, and may be appropriate for mass production. In addition, an LED chip, wavelength conversion materials such as phosphors, and an optical structure such as a lens may be integrally manufactured, so that the CSP may be appropriate for, particularly, lighting apparatuses.

Figure 15:
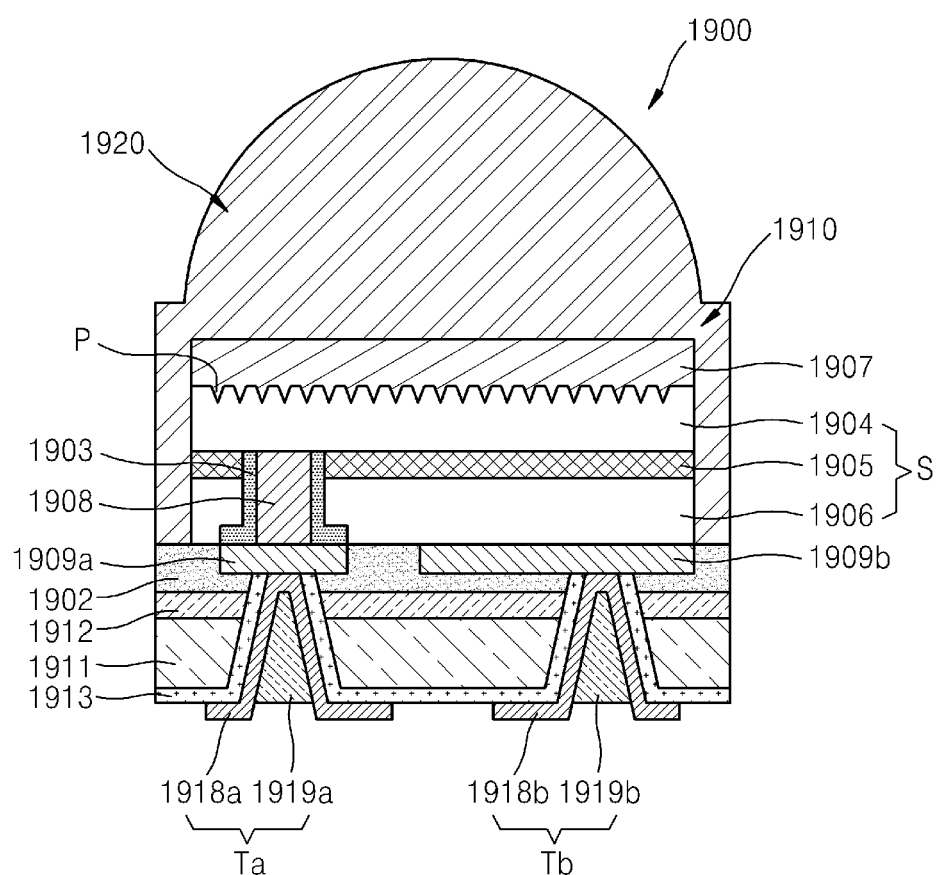
FIG. 15 illustrates an LED package that may be used in a light-emitting device package module, according to an embodiment of the present inventive concept.

FIG. 15 illustrates an LED package that may be used in an LED array, according to an embodiment of the present inventive concept. In a package structure illustrated in FIG. 15, as an example of the CSP, an electrode may be formed via a bottom surface of an LED 1910 that is in an opposite direction of a primary light extraction surface, and a phosphor layer 1907 and a lens 1920 may be integrally formed.

A CSP 1900 shown in FIG. 15 may include an emission stack S disposed on a mounting substrate 1911, first and second terminals Ta and Tb, the phosphor layer 1907, and the lens 1920.

The emission stack S may have a stack structure including first and second semiconductor layers 1904 and 1906, and an active layer 1905 disposed between the first and second semiconductor layers 1904 and 1906. In an embodiment of the present inventive concept, the first and second semiconductor layers 1904 and 1906 may be p-type and n-type semiconductor layers, respectively, and may be formed of a nitride semiconductor such as $Al_xIn_yGa_{(1-x-y)}N$ (0<x<1, 0<y<1, 0<x+y<1). Alternatively, the first and second semiconductor layers 1904 and 1906 may be formed of a GaAs-based semiconductor or a GaP-based semiconductor, other than the nitride semiconductor.

The active layer 1905 that is disposed between the first and second semiconductor layers 1904 and 1906 may emit light that has a predetermined energy due to recombination of electrons and holes and may have a MQW structure in which a quantum well layer and a quantum barrier layer are alternately stacked. The MQW structure may be an InGaN/GaN structure or an AlGaN/GaN structure.

The first and second semiconductor layers 1904 and 1906, and the active layer 1905 may be formed via a semiconductor layer growing procedure such as metal organic chemical vapor deposition (MOCVD), molecular beam epitaxy (MBE), hydride vapor phase epitaxy (HVPE), or the like, which is well known in the art.

In the LED 1910 shown in FIG. 15, a growth substrate may be already removed, and a concave-convex structure P may be formed on a surface of the LED 1910 from which the growth substrate is removed. Also, the phosphor layer 1907 may be formed as a light conversion layer on the surface whereon the concave-convex structure is formed.

The LED 1910 may have first and second electrodes 1909a and 1909b that contact the first and second semiconductor layers 1904 and 1906, respectively. The first electrode 1909a may include a conductive via 1908 that contacts the second conductive semiconductor layer 1904 by penetrating through the second conductive semiconductor layer 1906 and the active layer 1905. The conductive via 1908 may have an insulating layer 1903 formed between the active layer 1905 and the second semiconductor layer 1906, thereby preventing a short-circuit.

Referring to FIG. 15, one conductive via 1908 may be arranged, but in another embodiment of the present inventive concept, at least two conductive vias 1908 may be arranged for improved current distribution and may be arrayed in various forms.

The mounting substrate 1911 may be a supporting substrate, such as a silicon substrate, that can be easily applied to a semiconductor procedure, but examples of the mounting substrate 1911 may vary. The mounting substrate 1911 and the LED 1910 may be bonded to each other via bonding layers 1902 and 1912. The bonding layers 1902 and 1912 may be formed of an electrical insulation material or an electrical conduction material. Examples of the electrical insulation material may include oxide such as $SiO_2$, SiN, or the like, or resin materials including a silicon resin, an epoxy resin, or the like, and examples of the electrical conduction material may include Ag, Al, Ti, W, Cu, Sn, Ni, Pt, Cr, NiSn, TiW, AuSn, or an eutectic metal thereof. The bonding process may be performed in a manner in which the bonding layers 1902 and 1912 are arranged on bonding surfaces of the LED 1910 and the mounting substrate 1911 and then are bonded together.

A via that penetrates through the mounting substrate 1911 may be formed at a bottom surface of the mounting substrate 1911 so as to contact the first and second electrodes 1909a and 1909b of the bonded LED 1911. Then, an insulator 1913 may be formed on a side surface of the via and the bottom surface of the mounting substrate 1911. When the mounting substrate 1911 is formed as a silicon substrate, the insulator 1913 may be formed as a silicon oxide layer via a thermal oxidation procedure. By filling the via with a conductive material, the first and second terminals Ta and Tb may be formed to be connected to the first and second electrodes 1909a and 1909b. The first and second terminals Ta and Tb may include seed layers 1918a and 1918b, and plating chargers 1919a and 1919b that are formed by using the seed layers 1918a and 1918b via a plating procedure.

Figure 16:
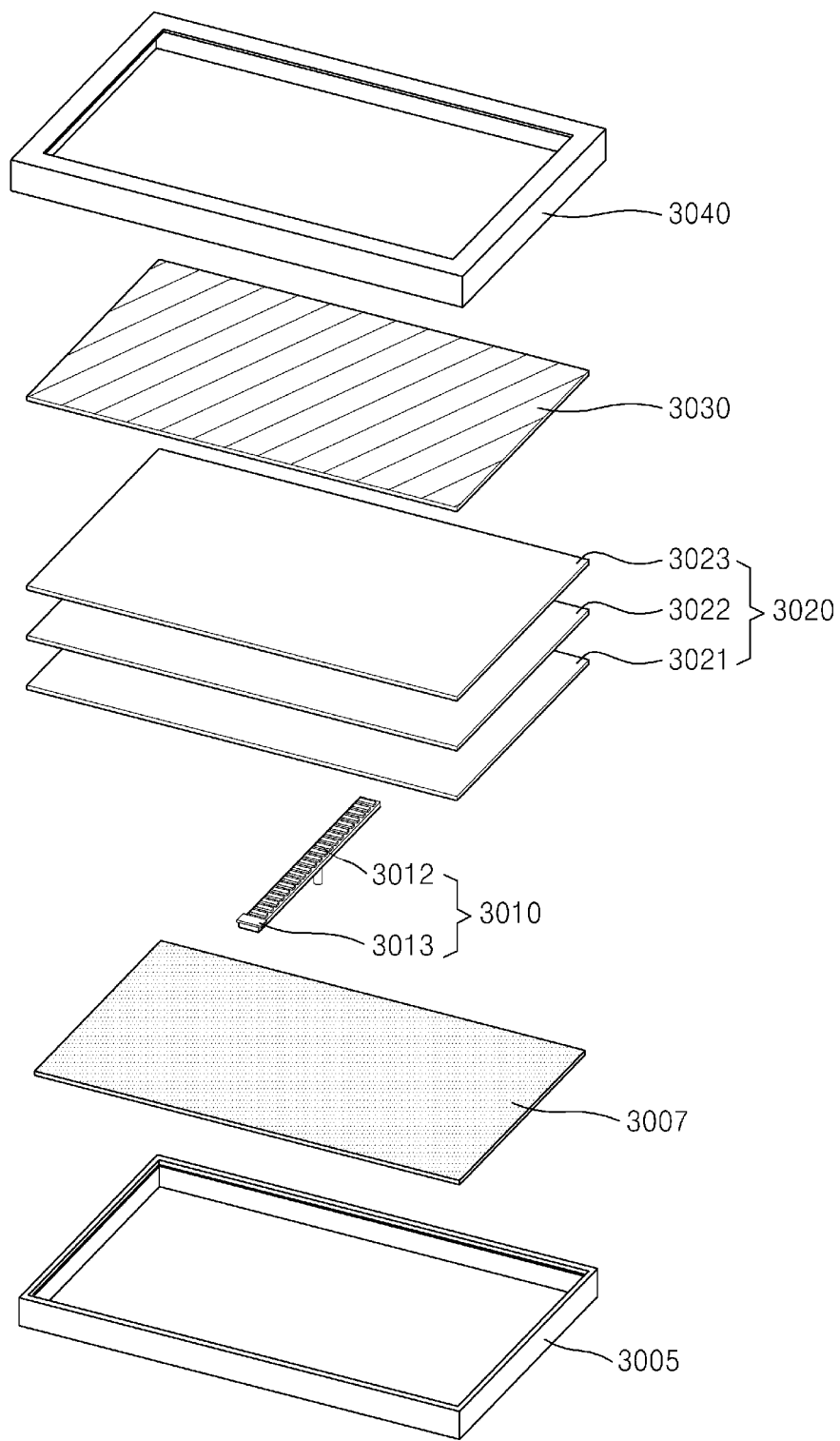
FIG. 16 is an exploded perspective view of a backlight assembly including an LED array unit according to an embodiment of the present inventive concept.

FIG. 16 is an exploded perspective view of a backlight assembly 3000 including an LED array unit according to the aforementioned embodiments of the present inventive concept. As illustrated in FIG. 16, the direct-type backlight assembly 3000 may include a bottom cover 3005, a reflection sheet 3007, an LED module 3010, an optical sheet 3020, a liquid crystal panel 3030, and a top cover 3040. According to an embodiment of the present inventive concept, an LED array unit according to the inventive concept may be used as the LED module 3010 included in the direct-type backlight assembly 3000.

According to an embodiment of the present inventive concept, the light-emitting module 3010 may include an LED array 3012 including at least one LED package and a circuit board, and a rank storing device 3013. As in the aforementioned embodiments of the present inventive concept, the rank storing device 3013 may store rank information of the LED array 3012. The LED array 3012 may receive power for use in light emission from an LED driving device outside the direct-type backlight assembly 3000, and the LED driving device may detect rank information of the LED array 3012, which is stored in the rank storing device 3013, and may adjust a current that is provided to the LED array 3012, based on the detected rank information.

The optical sheet 3020 may be provided above the light-emitting module 3010, and may include a diffusion sheet 3021, a condensing sheet 3022, and a protection sheet 3023. In other words, the diffusion sheet 3021, which diffuses the light emitted by the light-emitting module 3010, the condensing sheet 3022, which condenses the light diffused by the diffusion sheet 3021 in order to increase the brightness, and the protection sheet 3023, which protects the condensing sheet 3022 and secures a viewing angle, may be sequentially provided above the light-emitting module 3010.

The top cover 3040 may surround the edge of the optical sheet 3020 and may be assembled with the bottom cover 3005.

The liquid crystal panel 3030 may be further disposed between the optical sheet 3020 and the top cover 3040. The liquid crystal panel 3030 may include a first substrate (not separately shown) and a second substrate (not separately shown) that face each other and are bonded to each other by having a liquid crystal layer interposed between the first and second substrates. On the first substrate, a plurality of gate lines may intersect a plurality of data lines in order to define pixel regions, and a thin film transistor (TFT) may be included at each intersection of each pixel region and may be connected to a pixel electrode mounted on each pixel region in a one-to-one correspondence. The second substrate may include red (R), green (G), and blue (B) color filters that face pixel regions, respectively, and a black matrix that covers the gate lines, the data lines, the TFTs, and the edges of the R, G, and B color filters.

Figure 17:
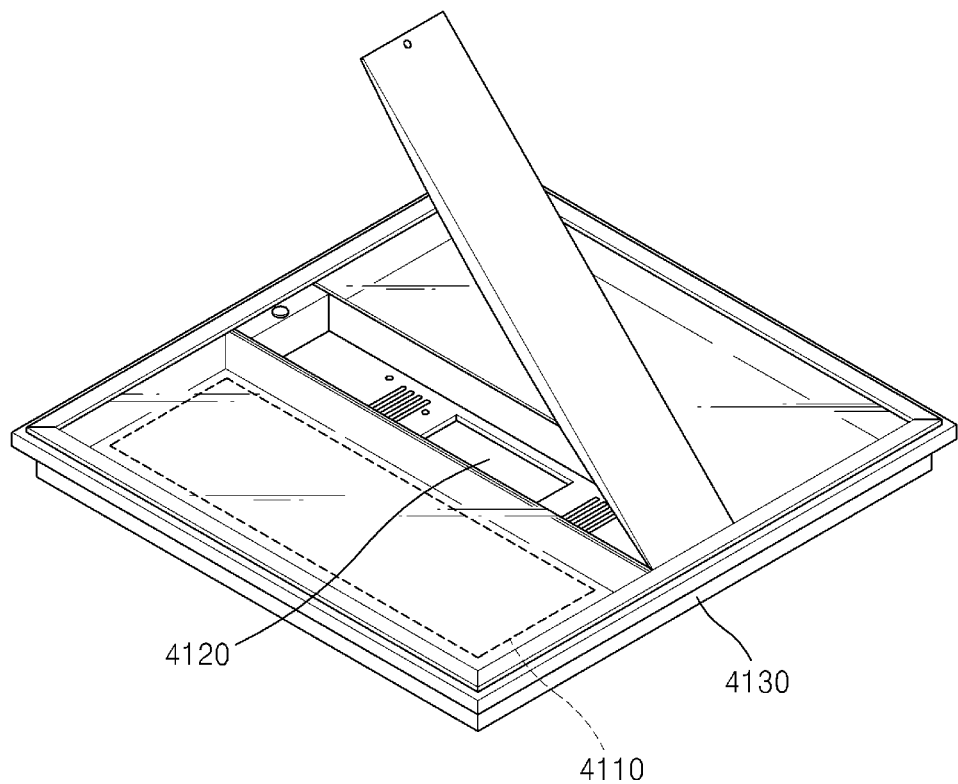
FIG. 17 is a perspective view of a plate-form lighting apparatus including an LED array unit and an LED module, according to an embodiment of the present inventive concept.

FIG. 17 is a perspective view of a plate-form lighting apparatus 4100 including an LED array unit and an LED module, according to the aforementioned embodiments of the inventive concept. The plate-form lighting apparatus 4100 may include a light source 4110, a power supply device 4120, and a housing 4130. According to an embodiment of the present inventive concept, the light source 4110 may include the aforementioned LED array unit, and the power supply device 4120 may include the aforementioned LED driving device.

The light source 4110 may be formed in an entirely-flat shape as illustrated in FIG. 17. According to an embodiment of the present inventive concept, the LED array unit may include an LED array, and a rank storing device that stores rank information of the LED array.

The power supply device 4120 may supply power to the light source 4110. According to an embodiment of the present inventive concept, the power supply device 4120 may include an adjustable current output device and a rank detecting device. The adjustable current output device and the rank detecting device may function equally with an adjustable current output device and a rank detecting device according to one of the aforementioned embodiments of the present inventive concept.

The housing 4130 may have a space for accommodating the light source 4110 and the power supply device 4120 therein, and have an hexahedral shape having one side open, but the shape of the housing 4130 is not limited thereto. The light source 4110 may be disposed to emit light to the open side of the housing 4130.

Figure 18:
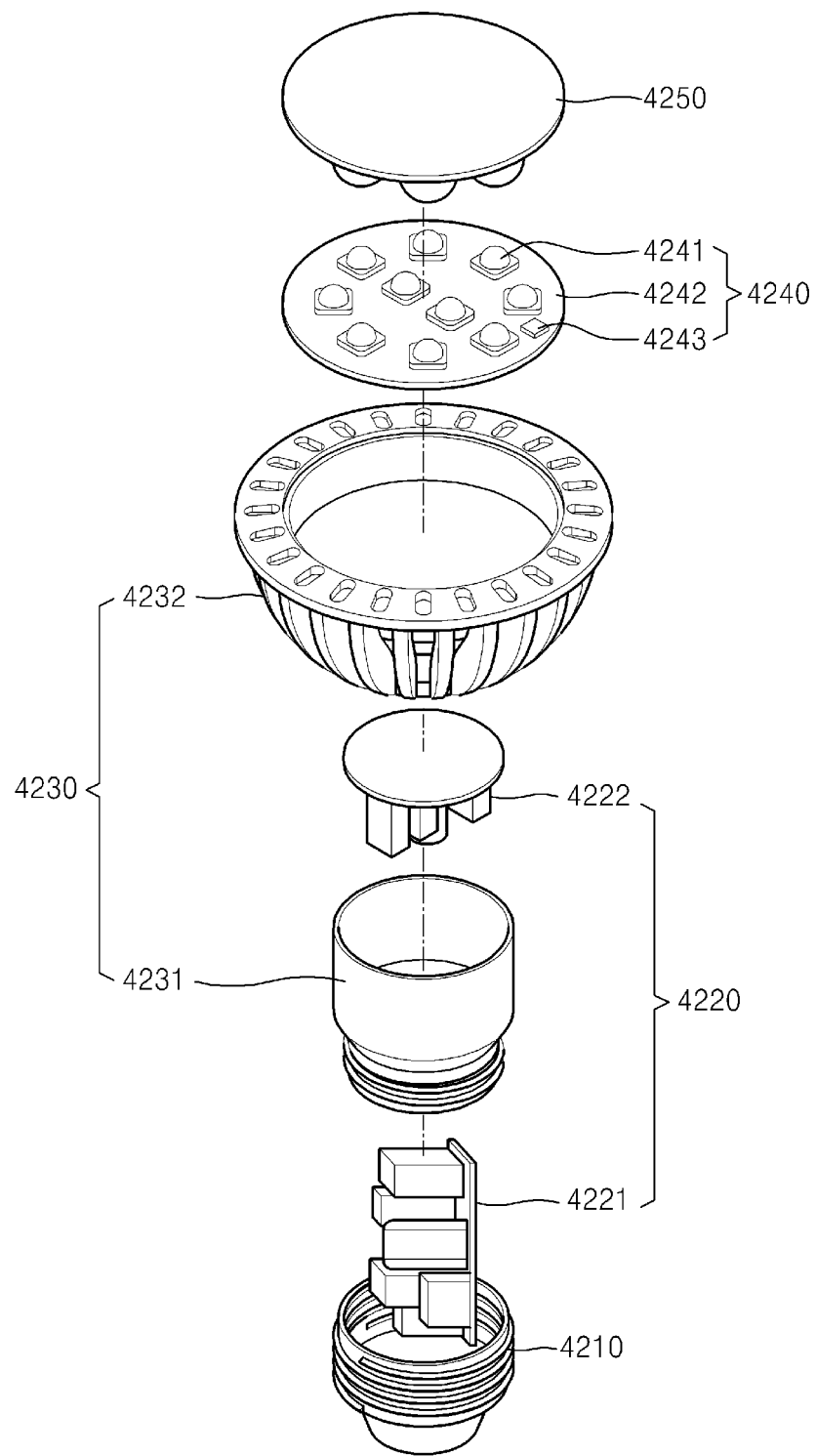
FIG. 18 is an exploded perspective view of a bulb-form lamp as a plate-form lighting apparatus including an LED array unit and an LED module, according to an embodiment of the present inventive concept.
Figure 19:
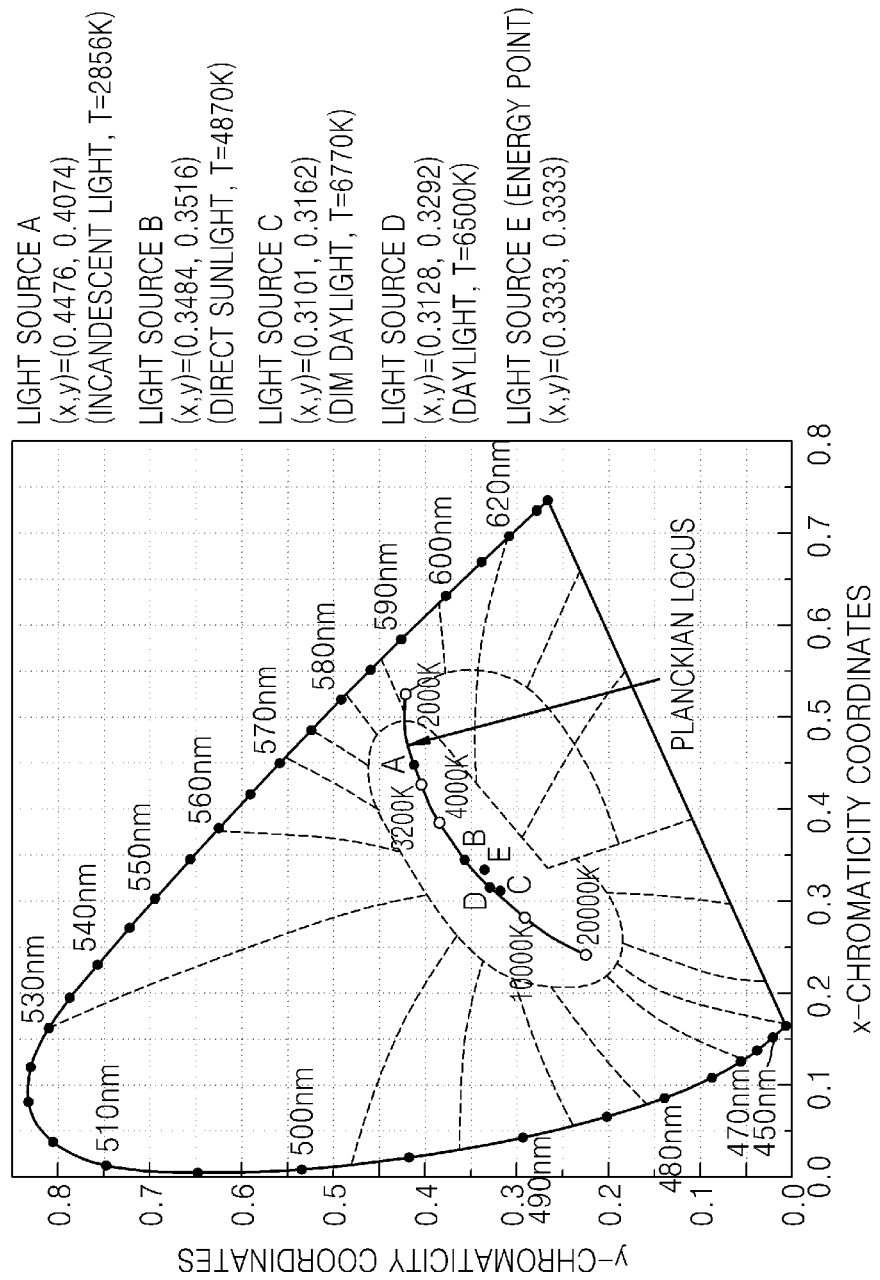
FIG. 19 is a CIE chromaticity diagram illustrating a color temperature spectrum of a perfect radiator, according to an embodiment of the present inventive concept.

FIG. 18 is an exploded perspective view of a bulb-form lamp as a lighting apparatus 4200 including an LED array unit and an LED module, according to the aforementioned embodiments of the present inventive concept. FIG. 19 is a CIE chromaticity diagram illustrating a color temperature spectrum of a perfect radiator, according to an embodiment of the present inventive concept. The lighting apparatus 4200 may include a socket 4210, a power source 4220, a heat dissipation member 4230, a light source 4240, and an optical member 4250. According to an embodiment of the present inventive concept, the light source 4240 may include an LED array unit according to the aforementioned embodiments of the present inventive concept, and the power source 4220 may include an LED driving device according to the aforementioned embodiments of the present inventive concept.

The socket 4210 may be replaceable by an existing lighting apparatus. Power may be supplied to the lighting apparatus 4200 via the socket 4210. As illustrated in FIG. 18, the power source 4220 may include a first power 4221 and a second power 4222. The power source 4220 may include an LED driving unit according to one of the aforementioned embodiments of the present inventive concept. In other words, the power source 4220 may include an adjustable current output device and a rank detecting device, and the adjustable current output device and the rank detecting device may function equally with an adjustable current output device and a rank detecting device according to one of the aforementioned embodiments.

The heat dissipation member 4230 may include an internal heat dissipation member 4231 and an external heat dissipation member 4232. The internal heat dissipation member 4231 may be connected directly to the light source 4240 and/or the power source 4220. Heat may be transmitted to the external heat dissipation member 4232 via the internal heat dissipation member 4231.

The optical member 4250 may include an internal optical member (not separately shown) and an external optical member (not separately shown), and may be configured so that the light source 4240 may evenly diffuse emitted light.

The light source 4240 may receive power from the power source 4240 and emit light to the optical member 4250. The light source 4240 may include an LED array unit according to one of the aforementioned embodiments of the present inventive concept. The light source 4240 may include at least one LED package 4241, a circuit board 4242, and a rank storing device 4243. The rank storing device 4243 may store the rank information of the LED packages 4241.

The LED packages 4241 included in the light source 4240 may be homogeneous devices that generate light having the same wavelength. Alternatively, the LED packages 4241 may be heterogeneous devices that generate light having different wavelengths. For example, the LED packages 4241 may include at least one of an LED that is a combination of a blue-light LED and a phosphor having a color of yellow, green, red, or orange and that emits white light, and an LED that emits a purple color, a blue color, a green color, a red color, or infrared light. In this case, the lighting apparatus 4200 may adjust a Color Rendering Index (CRI) of a solar level in sodium (Na) and also may generate a variety of white light beams from a candle temperature level (e.g., 1500K) to a blue sky temperature level (e.g., 12000K). The lighting apparatus 4200 may adjust a lighting color according to the ambient atmosphere or mood by generating visible light having a color of purple, blue, green, red, or orange, or infrared light. Also, the lighting apparatus 4200 may generate light having a special wavelength capable of promoting a growth of plants.

White light that corresponds to a combination of the blue-light LED with the yellow, green, and red phosphors and/or green and red light LEDs may have at least two peak wavelengths. As illustrated in FIG. 19, the white light may be positioned at a line segment that connects (x, y) coordinates (0.4476, 0.4074), (0.3484, 0.3516), (0.3101, 0.3162), (0.3128, 0.3292), and (0.3333, 0.3333) of a CIE 1931 coordinate system. Alternatively, the white light may be positioned in a region that is surrounded by the line segment and a blackbody radiation spectrum. A color temperature of the white light may be between 2000K through 20000K.

Figure 20:
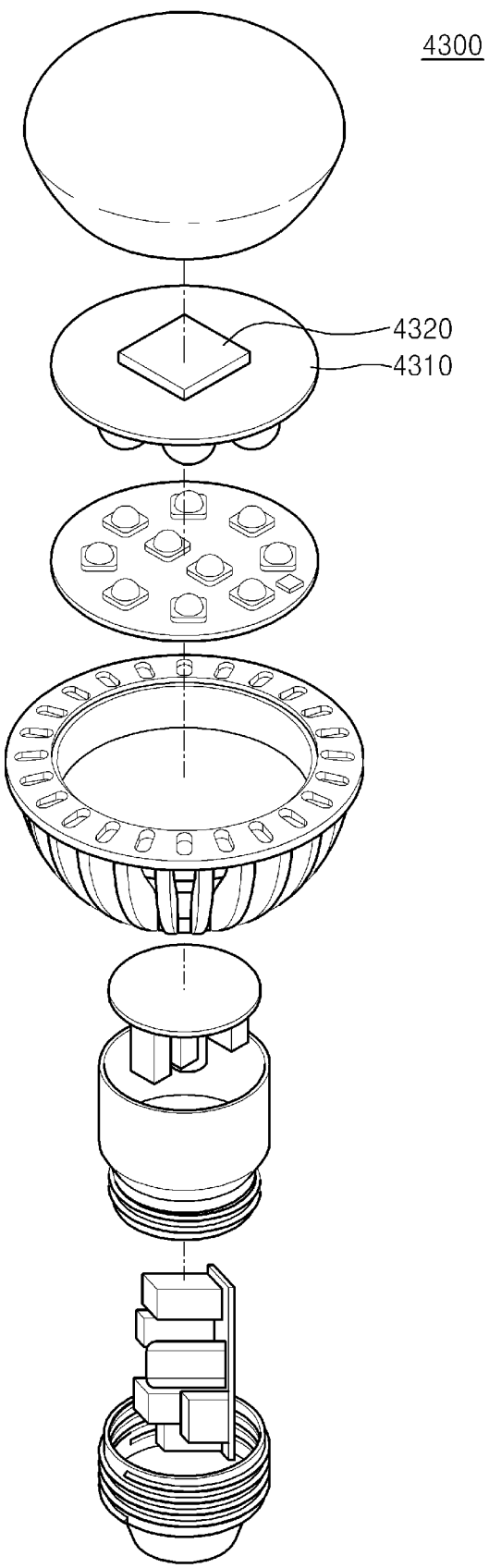
FIG. 20 is an exploded perspective view of a lamp that includes an LED array unit, an LED module, and a communication module, according to an embodiment of the present inventive concept.

FIG. 20 is an exploded perspective view of a lamp 4300 that includes an LED array unit, an LED module, and a communication module, according to the aforementioned embodiments of the present inventive concept. The lamp 4300 may be different from the lighting apparatus 4200 of FIG. 18 in that a reflection plate 4310 is disposed on the light source 4240, and that the reflection plate 4310 evenly diffuses the light emitted from the light source 4240 side-wards and rear-wards to thereby reduce dazzle.

A communication module 4320 may be mounted on the reflection plate 4310, such that home-network communications are possible via the communication module 4320. For example, the communication module 4320 may be a wireless communication module that uses Zigbee, and may control in-house illumination such as the on/off operation, brightness adjustment, and the like of the lamp 4300, via a smart phone or a wireless controller.

Figure 21:
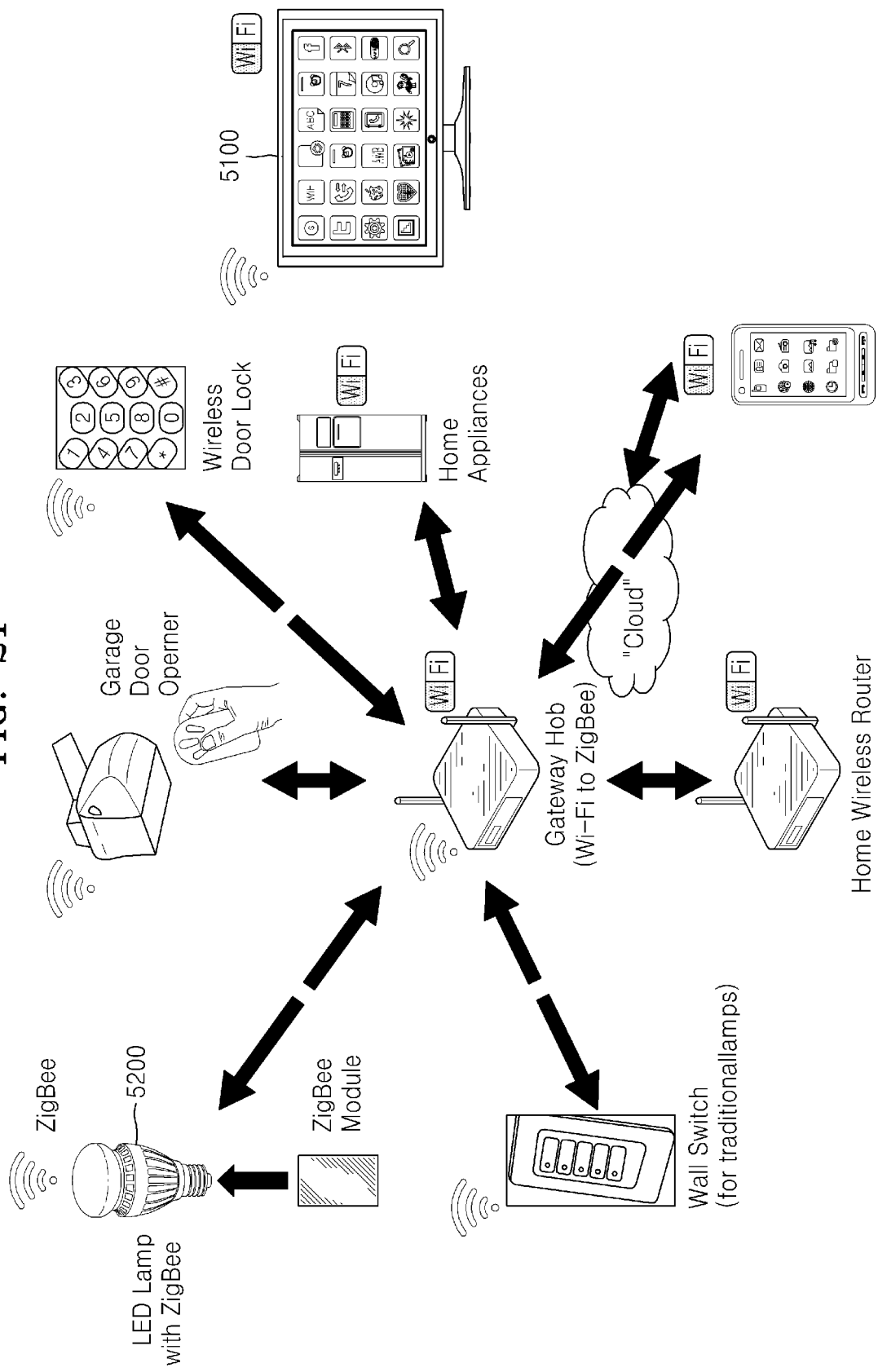
FIG. 21 illustrates a home network to which a lighting system using a photo sensor-integrated tubular light emitting apparatus is applied, according to an embodiment of the present inventive concept.

FIG. 21 illustrates a home network to which a lamp including an LED array unit and an LED module is applied, according to the aforementioned embodiments of the present inventive concept. According to operating statuses of a bedroom, a living room, an entrance, a garage, electric home appliances, or the like and ambient environments/situations, illumination brightness of an LED lamp 5200 may be automatically adjusted by using in-house wireless communication such as ZigBee, Wi-Fi, or the like.

For example, as illustrated in FIG. 21, according to a type of a program broadcasted on a TV 5100 or brightness of a screen of the TV 5100, illumination brightness of the LED lamp 5200 may be automatically adjusted. In an embodiment of the present inventive concept, when a cozy atmosphere is required due to broadcasting of human drama, illumination may be adjusted to have a color temperature equal to or less than 12000K according to the cozy atmosphere, and the color of the illumination may be adjusted. In another embodiment of the present inventive concept, when a light atmosphere is required due to broadcasting of a comedy program, illumination may be adjusted to have a color temperature equal to or greater than 12000K and may have a blue-based white color.

Figure 22:
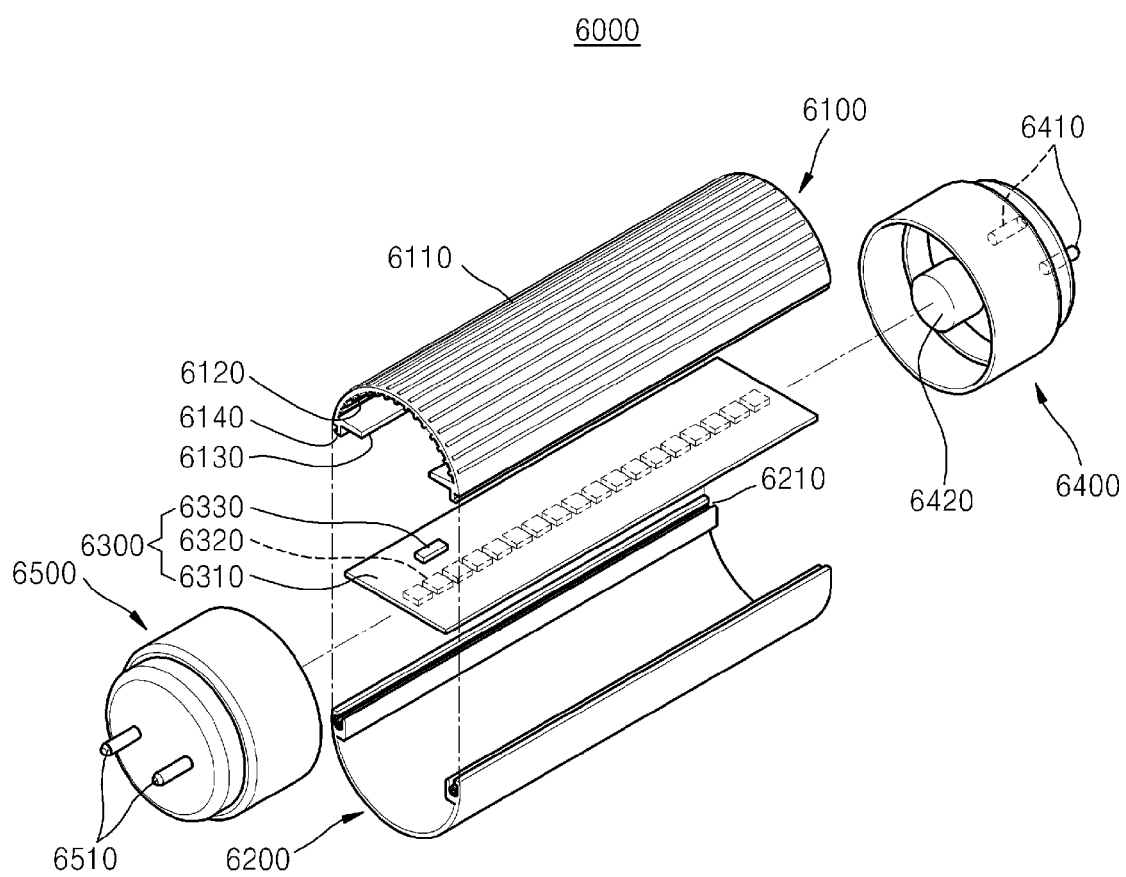
FIG. 22 is an exploded perspective view of a photo sensor-integrated tubular light emitting apparatus 10A according to the embodiment of the present inventive concept.

FIG. 22 is an exploded perspective view of a light emitting apparatus 6000 including an LED array unit and an LED module, according to the aforementioned embodiments of the present inventive concept. As illustrated in FIG. 22, the light emitting apparatus 6000 may include a heat dissipation member 6100, a cover 6200, a light-emitting module 6300, a first socket 6400, and a second socket 6500. A plurality of heat dissipation pins 6110 and 6120 may be formed in a concave-convex structure on inner and/or outer surfaces of the heat dissipation member 6100, and in this regard, the heat dissipation pins 6110 and 6120 may be designed to have various shapes and intervals. A projected supporting member 6130 may be formed at an inner side of the heat dissipation member 6100. The light-emitting module 6300 may be fixed at the supporting member 6130. A hook 6140 may be formed at both ends of the heat dissipation member 6100.

A groove 6210 may be formed at the cover 6200, and the hook 6140 of the heat dissipation member 6100 may be combined with the groove 6210 in a hook-combination manner. For example, positions of the groove 6210 and the hook 6140 may be switched.

The light emitting module 6300 may include an LED array unit according to one of the aforementioned embodiments of the present inventive concept. The light-emitting module 613 may include a printed circuit board (PCB) 6310, an LED array 6320, and a rank storing device 6330. As described above in the aforementioned embodiments of the present inventive concept, the rank storing device 6330 may store rank information of the LED array 6320. The PCB 6310 may include circuit wirings to operate the LED array 6320. The PCB 6310 may further include the other components in order to operate the LED array 6320.

The first and second sockets 6400 and 6500 may be a pair of sockets and may be combined with ends of a cylindrical cover that is formed of the heat dissipation member 6100 and the cover 6200.

For example, the first socket 6400 may include an electrode terminal 6410 and a power supply device 6420, and the second socket 6500 may include a dummy terminal 6510. The power supply device 6420 may include an LED driving device according to one of the aforementioned embodiments of the present inventive concept. In detail, the power supply device 6420 may include an adjustable current output device and a rank detecting device, and the adjustable current output device and the rank detecting device may function equally with an adjustable current output device and a rank detecting device according to one of the aforementioned embodiments of the present inventive concept.

Also, a photo sensor module may be mounted in the first socket 6400 or the second socket 6500. In an embodiment of the present inventive concept, the photo sensor module may be mounted in the second socket 6500 at which the dummy terminal 6510 is disposed. In another embodiment of the present inventive concept, the photo sensor module may be mounted in the first socket 6400 at which the electrode terminal 6410 is disposed.

Figure 23:
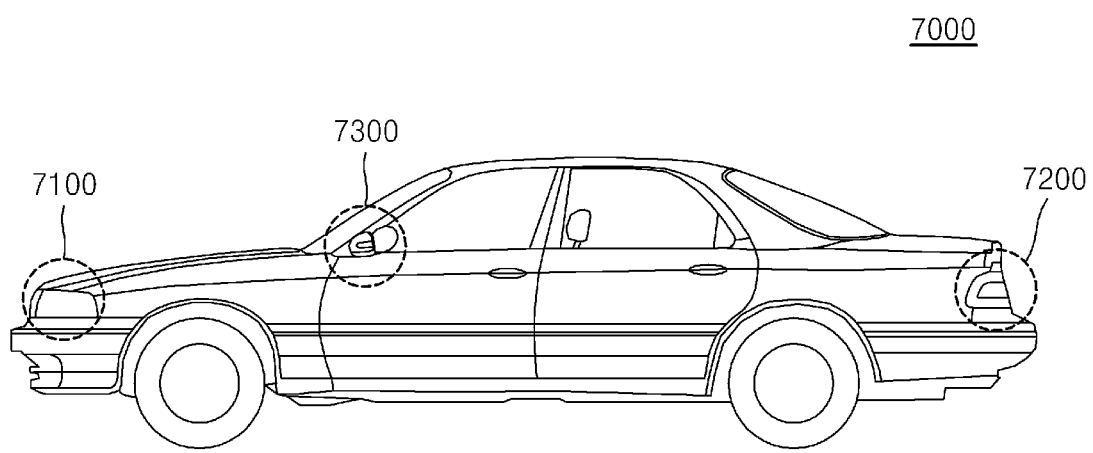
FIG. 23 illustrates a vehicle that includes an LED array unit, an LED module, and a communication module, according to an embodiment of the present inventive concept.

FIG. 23 illustrates a vehicle 7000 that may include an LED array unit and an LED module according to the aforementioned embodiments of the present inventive concept. In the vehicle 7000, such as an automobile or a motorcycle, an LED module according to one of the aforementioned embodiments may be used as a light source of a lamp that emits light to the outside of the vehicle 7000. The intensity of light emitted by the lamp used in the vehicle 7000 may be prescribed according to nations or regions. For example, the lamp used in the vehicle 7000 may be prescribed to emit light with a suitable intensity in order to secure a clear view of a driver or achieve the safety of the other drivers, and this regulation may have an upper limit and a lower limit to form the range of light intensity.

The vehicle 7000 may include a first lamp 7100 provided on the front side of the vehicle 7000, a second lamp 7200 provided on the rear side of the vehicle 7000, and a third lamp 7300 provided on the lateral side of the vehicle 7000. Since the first through third lamps 7100 through 7300 may require different ranges of light intensities according to the positions where they are installed, the first through third lamps 7100 through 7300 may have different upper limits and different lower limits. An LED module according to an embodiment of the present inventive concept may emit light with an intensity that satisfies a prescribed range, regardless of the characteristics of an LED array unit.

An LED module including an LED array unit and an LED driving device according to an embodiment of the present inventive concept may be manufactured during the manufacture of the vehicle 7000. For example, according to structural characteristics of the vehicle 7000, the LED array unit and the LED driving device may not be provided as a single LED module in the vehicle 7000 but may be separately provided in the vehicle 7000 and connected to each other. According to the aforementioned embodiments of the present inventive concept, the LED array unit may include a rank storing device that stores the rank information of an LED array included in the LED array unit, and the LED driving device may include a rank detecting device, which detects the rank information of the rank storing device, and an adjustable current output device. Thus, the LED array unit and the LED driving device may be mounted in the vehicle 7000 during the manufacture of the vehicle 700, without needing to consider the characteristics of the LED array unit.

While the present inventive concept has been particularly shown and described with reference to exemplary embodiments thereof, it will be understood that various changes in form and details may be made therein without departing from the spirit and scope of the following claims.

What is claimed is:
1. A light emitting device (LED) array module, comprising:
   first and second terminals;
   a light emitting device (LED) array comprising a plurality of LEDs that emit light when a current is supplied from the outside of the LED array module; and
   a rank storing device configured to store rank information of the LED array that depends on brightness character- istics of the LEDs, and to output a signal corresponding to the rank information via the first and second terminals,
wherein the rank storing device stores the rank information of the LED array according to an interconnection status of the first and second terminals.

2. The LED array module of claim 1, wherein
the LED array has one of a first rank and a second rank, and according to the rank storing device, when the LED array has the first rank, the first and second terminals are open, and, when the LED array has the second rank, the first and second terminals are connected to each other via a resistor or short-circuited.

3. A backlight assembly, comprising:
an LED array module of claim 1;
an optical sheet disposed above the light emitting module;
a top cover surrounding edges of the optical sheet; and
a bottom cover assembled with the top cover.

4. A lighting apparatus, comprising:
a light source including an LED array module of claim 1;
a power supply device including an LED driving device configured to supply a current to the LED array of the LED array module and control a magnitude of a current according to the rank information stored in the rank storing device of the LED array module; and
an housing having a space defined therein to accommodate the light source and the power supply such that the light source emits light to an open side of the housing.

5. The LED array module of claim 1, wherein
the ranks of the LEDs are identical, and
the rank of the LED array is the same as each of the ranks of the LEDs.

6. A lighting apparatus, comprising:
a light source including an LED array unit of claim 1;
a power source including an LED driving device configured to supply a current to the LED array of the LED array module and control a magnitude of a current according to the rank information stored in the rank storing device of the LED array module;
a heat dissipation member including an internal heat dissipation member and an external heat dissipation member, the internal heat dissipation member being directly connected to one of the light source and the power source such that heat is transmitted to the external heat dissipation member via the internal heat dissipation member.

7. An LED module, comprising:
an LED array unit comprising an LED array including a plurality of LEDs, and a rank storing device configured to store rank information of the LED array according to brightness characteristics of the LEDs; and
an LED driving device configured to supply a current to the LED array and control a magnitude of the current according to the rank information stored in the rank storing device,
wherein the LED driving device comprises:
    a rank detecting device which detects a signal corresponding to the rank information stored in the rank storing device; and
    an adjustable current output device configured to output a current for driving the LED array and to be controlled by the rank detecting device.

8. The LED module of claim 7, wherein
the LED array unit further comprises at least one terminal,
the rank storing device is configured to output the signal corresponding to the rank information via the terminal, and
the rank detecting device is connected to the terminal.

9. The LED module of claim 8, wherein
the terminal comprises first and second terminals,
the LED array has one of a first rank and a second rank, and according to the rank storing device, when the LED array has the first rank, the first and second terminals are open, and, when the LED array has the second rank, the first and second terminals are connected to each other via a resistor or short-circuited.

10. The LED module of claim 9, wherein
the rank detecting device comprises a microcontroller,
the first or second terminal is connected to an input port of the microcontroller, and
the microcontroller is configured to determine a rank of the LED array according to a voltage of the input port.

11. The LED module of claim 8, wherein
the terminal comprises first and second terminals,
the rank storing device comprises a resistor connected between the first and second terminals, and
the resistor has different resistances when the LED array has different ranks.

12. The LED module of claim 11, wherein the rank detecting device is configured to detect a resistance of the resistor to determine the rank of the LED array.

13. The LED module of claim 12, wherein the rank detecting device comprises:
    a current source circuit configured to supply a constant current to the first or second terminal; and
    a voltage measuring circuit configured to measure a voltage between the first and second terminals.

14. The LED module of claim 12, wherein the rank detecting device comprises:
    a voltage source circuit configured to apply a constant current to between the first and second terminals; and
    a current measuring circuit configured to measure a current that flows to the first or second terminal.

15. The LED module of claim 8, wherein the rank detecting device is configured to control the adjustable current output device to supply a current that enables the LED array to emit light with a prescribed intensity.

16. The LED module of claim 9, wherein
the rank detecting device is configured to apply first and second voltages to the first and second terminals, respectively, and
the adjustable current output device is connected to the second terminal and is configured to adjust a magnitude of a current that is output according to a voltage of the second terminal.

17. A light emitting device (LED) array module comprising:
first and second terminals;
a light emitting device (LED) array comprising a plurality of LEDs that emit light when a current is supplied from the outside of the LED array module; and
a rank storing device configured to store rank information of the LED array that depends on brightness characteristics of the LEDs, and to output a signal corresponding to the rank information via the first and second terminals,
wherein the rank storing device comprises a resistor connected between the first and second terminals, and
wherein the resistor has different resistances when the LED array has different ranks.

18. A lighting apparatus, comprising:
a light source including an LED array unit of claim 17;
a power source including an LED driving device configured to supply a current to the LED array of the LED array module and control a magnitude of a current according to the rank information stored in the rank storing device of the LED array module;

a heat dissipation member including an internal heat dissipation member and an external heat dissipation member, the internal heat dissipation member being directly connected to one of the light source and the power source such that heat is transmitted to the external heat dissipation member via the internal heat dissipation member.

19. A lighting apparatus, comprising:

a light source including an LED array module of claim 17;

a power supply device including an LED driving device configured to supply a current to the LED array of the LED array module and control a magnitude of a current according to the rank information stored in the rank storing device of the LED array module; and a housing having a space defined therein to accommodate the light source and the power supply such that the light source emits light to an open side of the housing.

* * * * *